United States Patent [19]

Staab et al.

[11] Patent Number: 5,265,124
[45] Date of Patent: Nov. 23, 1993

[54] INTEGRATED MULTI-PORT REPEATER HAVING SHARED RESOURCES

[75] Inventors: David Staab, San Jose; Nader Vijeh, Cupertino, both of Calif.

[73] Assignee: Advanced Micro Devices Inc., Sunnyvale, Calif.

[21] Appl. No.: 595,061

[22] Filed: Oct. 10, 1990

Related U.S. Application Data

[63] Continuation-in-part of Ser. No. 556,046, Jul. 20, 1990, and a continuation-in-part of Ser. No. 480,426, Feb. 15, 1990, Pat. No. 5,164,960.

[51] Int. Cl.⁵ .............................................. H04B 3/36
[52] U.S. Cl. ......................................... 375/3; 375/3.1
[58] Field of Search ............... 375/3.1, 3; 370/85, 370/86, 94, 95, 55, 88, 97, 31; 379/338; 455/7

[56] References Cited

U.S. PATENT DOCUMENTS

| | | | |
|---|---|---|---|
| 4,825,435 | 4/1989 | Amundsen et al. | 370/97 |
| 4,985,892 | 1/1991 | Camarata | 370/123 |
| 5,034,945 | 7/1991 | Kimoto et al. | 370/13.1 |

FOREIGN PATENT DOCUMENTS

| | | |
|---|---|---|
| 137948 | 8/1984 | European Pat. Off. . |
| 193453 | 2/1986 | European Pat. Off. . |
| 2410957B1 | 3/1974 | Fed. Rep. of Germany . |

*Primary Examiner*—Stephen Chin
*Attorney, Agent, or Firm*—Townsend and Townsend Khourie and Crew

[57] ABSTRACT

A discrete integrated repeater device and port MAU/AUI functions shares resources among its several ports. The device includes a single multi-bit free running counter providing preselected timing intervals to a plurality of latches. A signal undergoing measurement clears the latch while a preselected timing signal sets the latch. Receipt of a timing signal at a set latch indicates success or failure of some particular condition under test. The device satisfies an IEEE 802.3 specification for execution of a link integrity test. The device is also able to selectively disable or enable the link integrity test function for particular ports. A plurality of latches, one associated with each port, is set upon carrier sense detection at the particular port. A token passing mechanism implemented with a daisy chained line coupled to each latch enables a polling of each latch to provide carrier sense information about each port in a serial format. The device shares a single PLL among all its ports by producing a logical sum of carrier sense inputs to enable activation of the PLL. A collision indication signal will override operation of the PLL to ensure data integrity and to allow the PLL to reacquire lock on its reference clock.

13 Claims, 41 Drawing Sheets

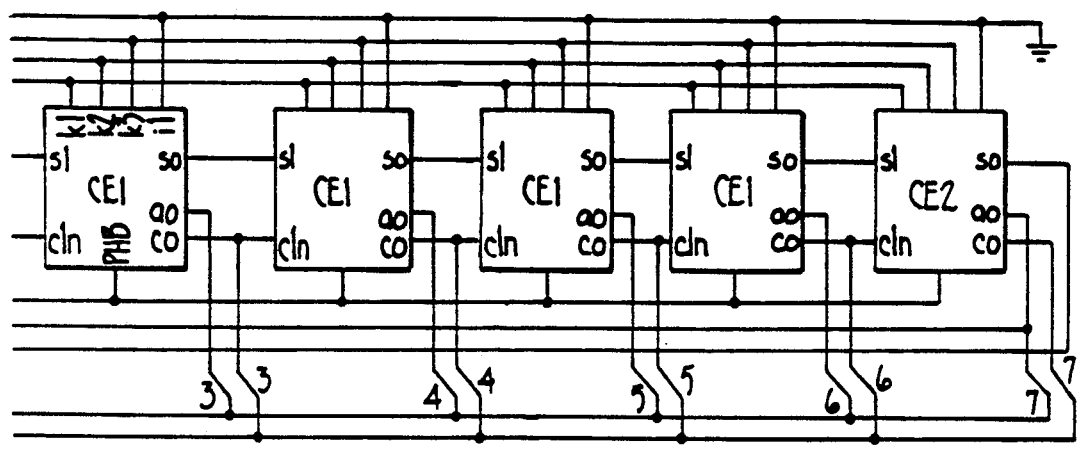
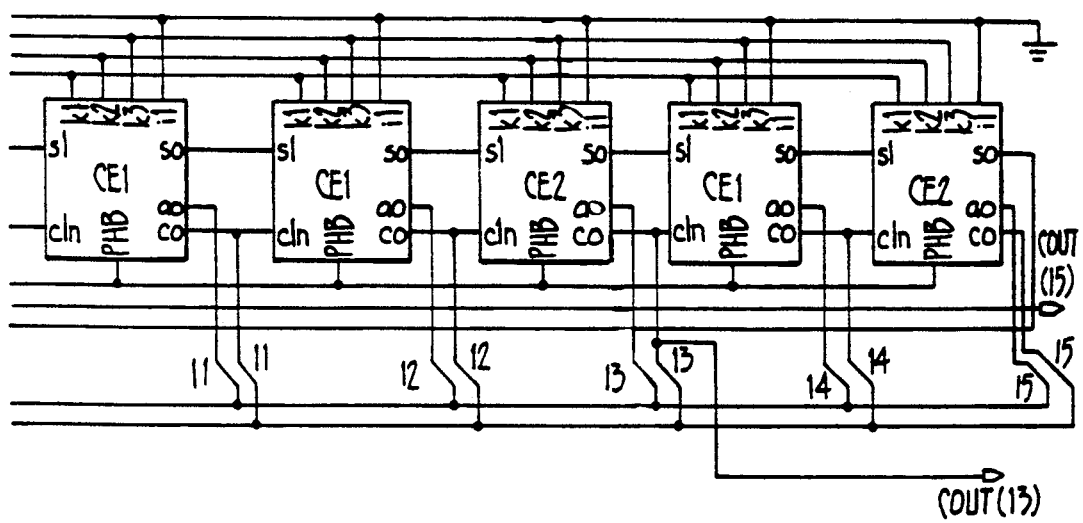
FIG. 4B.
| FIG. 4A. | FIG. 4B. |
FIG. 4.

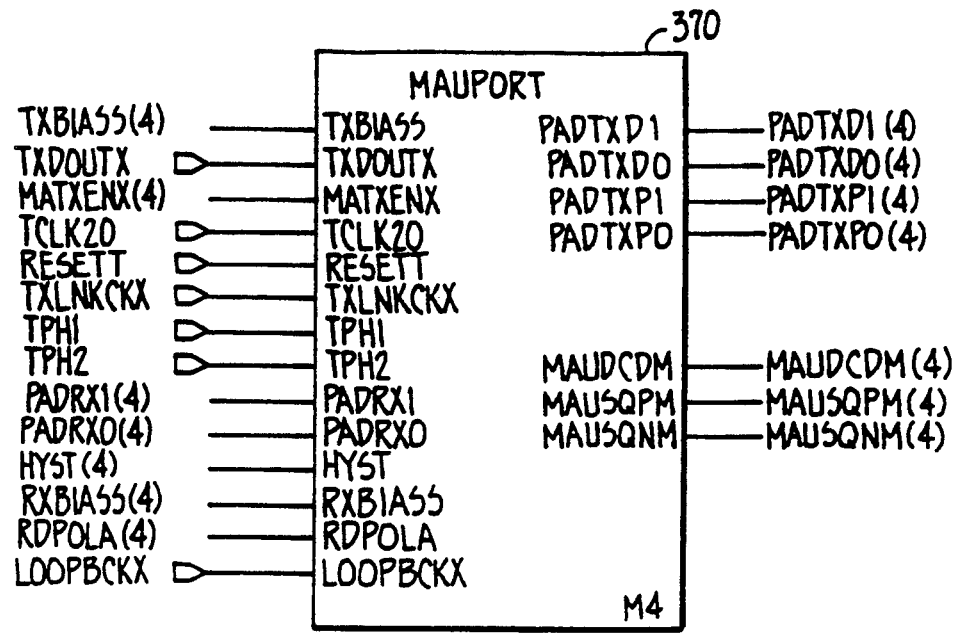
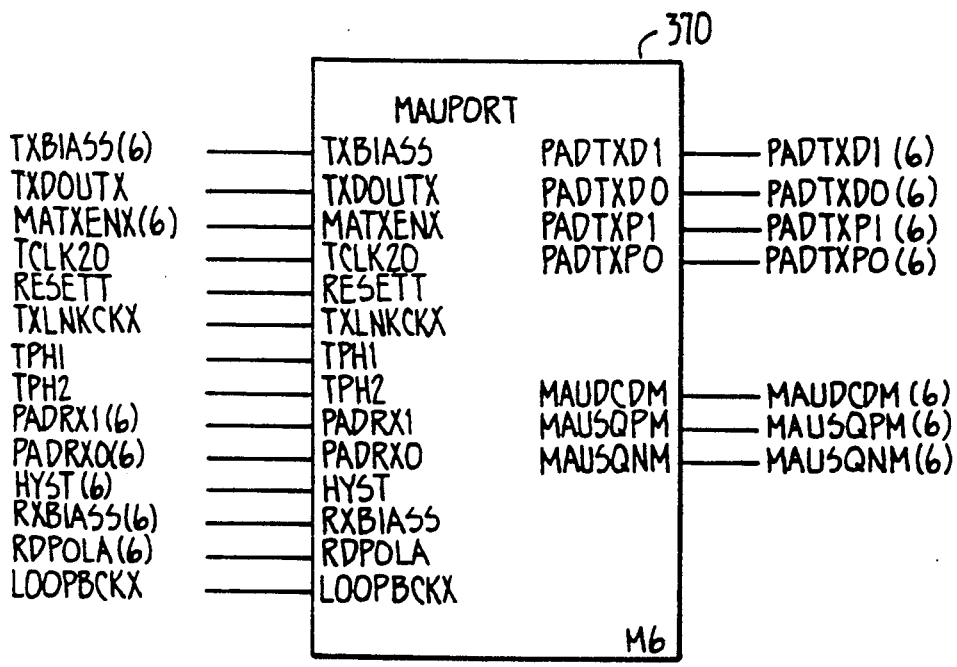
FIG. 6C.
| FIG. 6A. | FIG. 6B. |
| --- | --- |
| FIG. 6C. | FIG. 6D. |
FIG. 6.

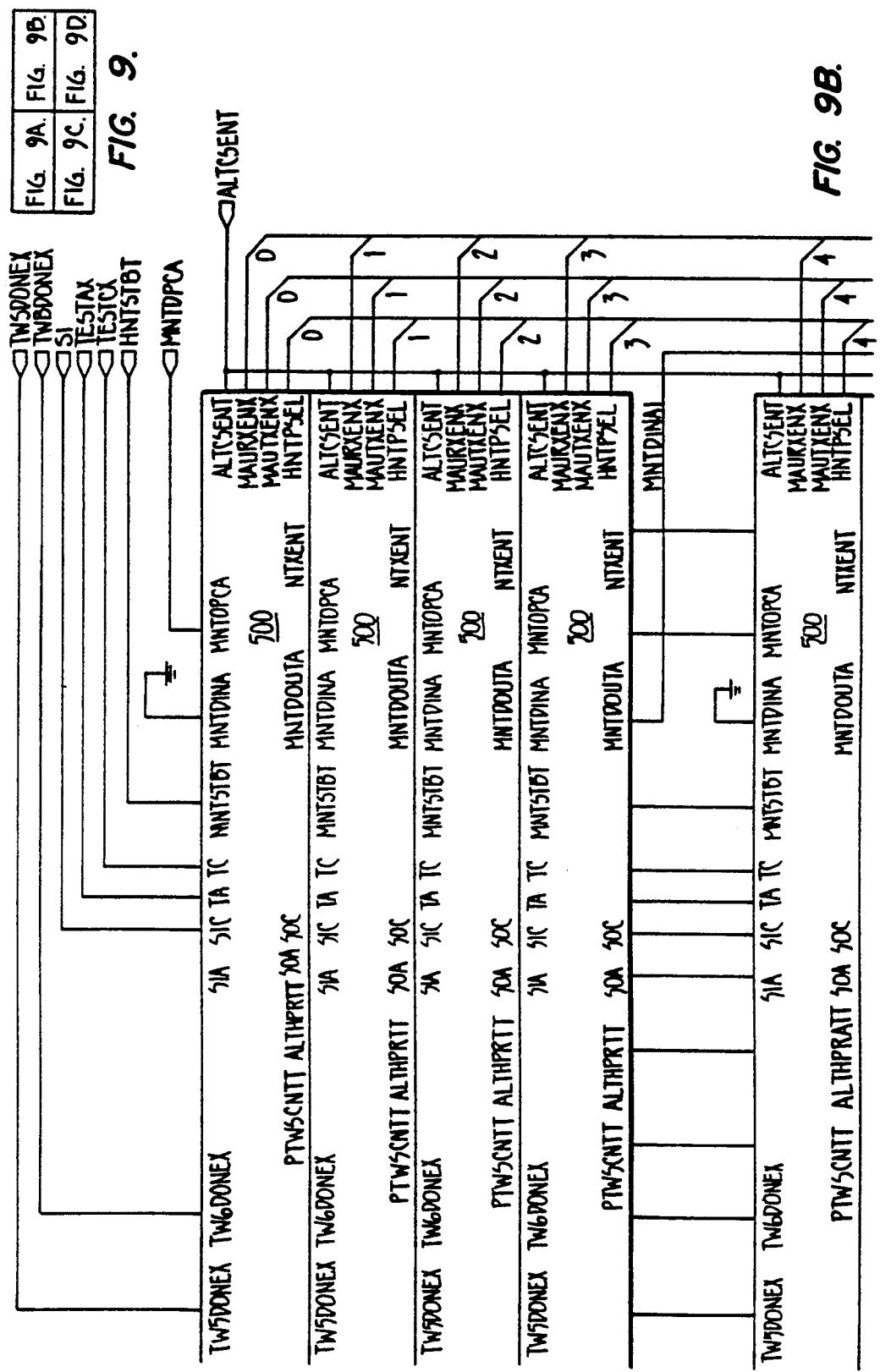

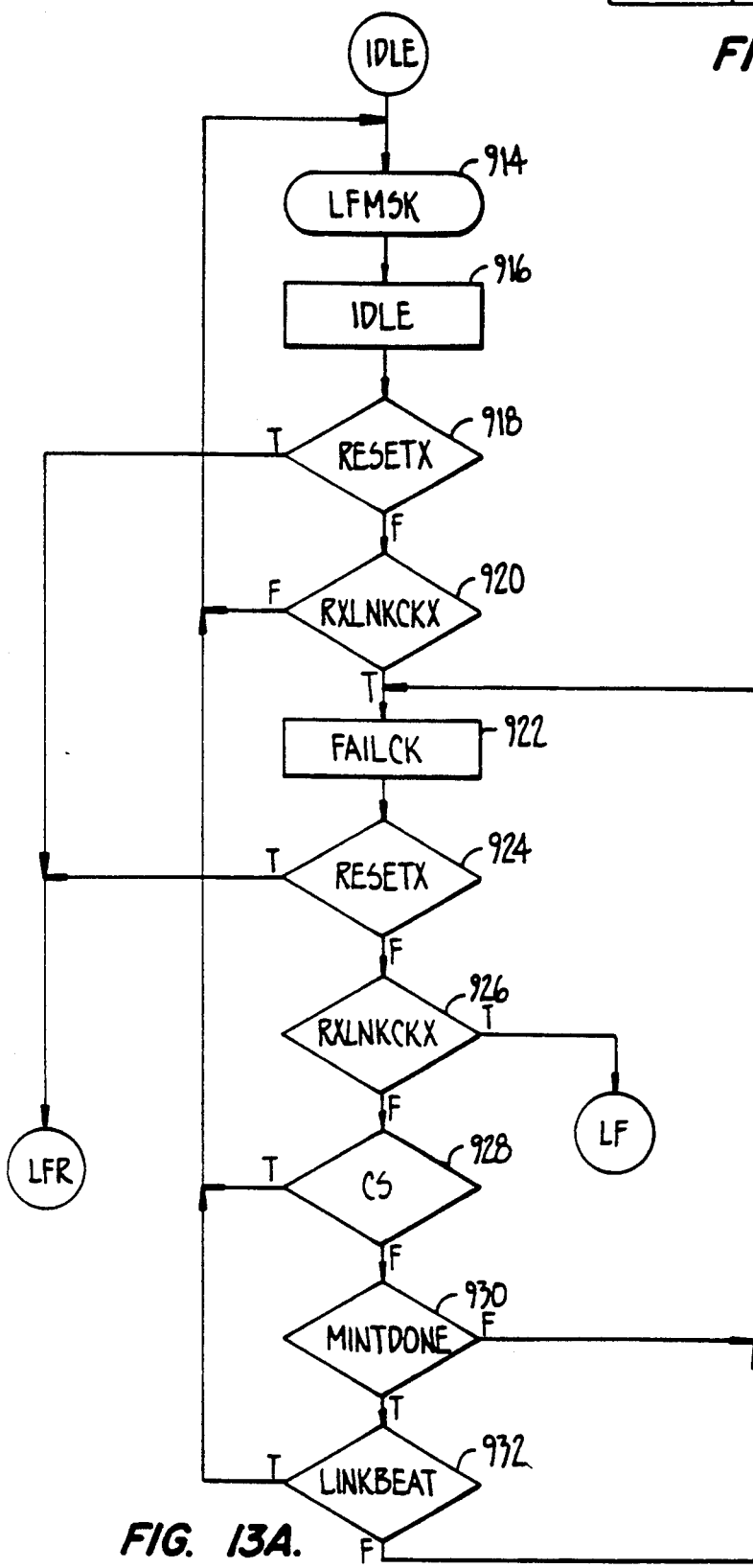

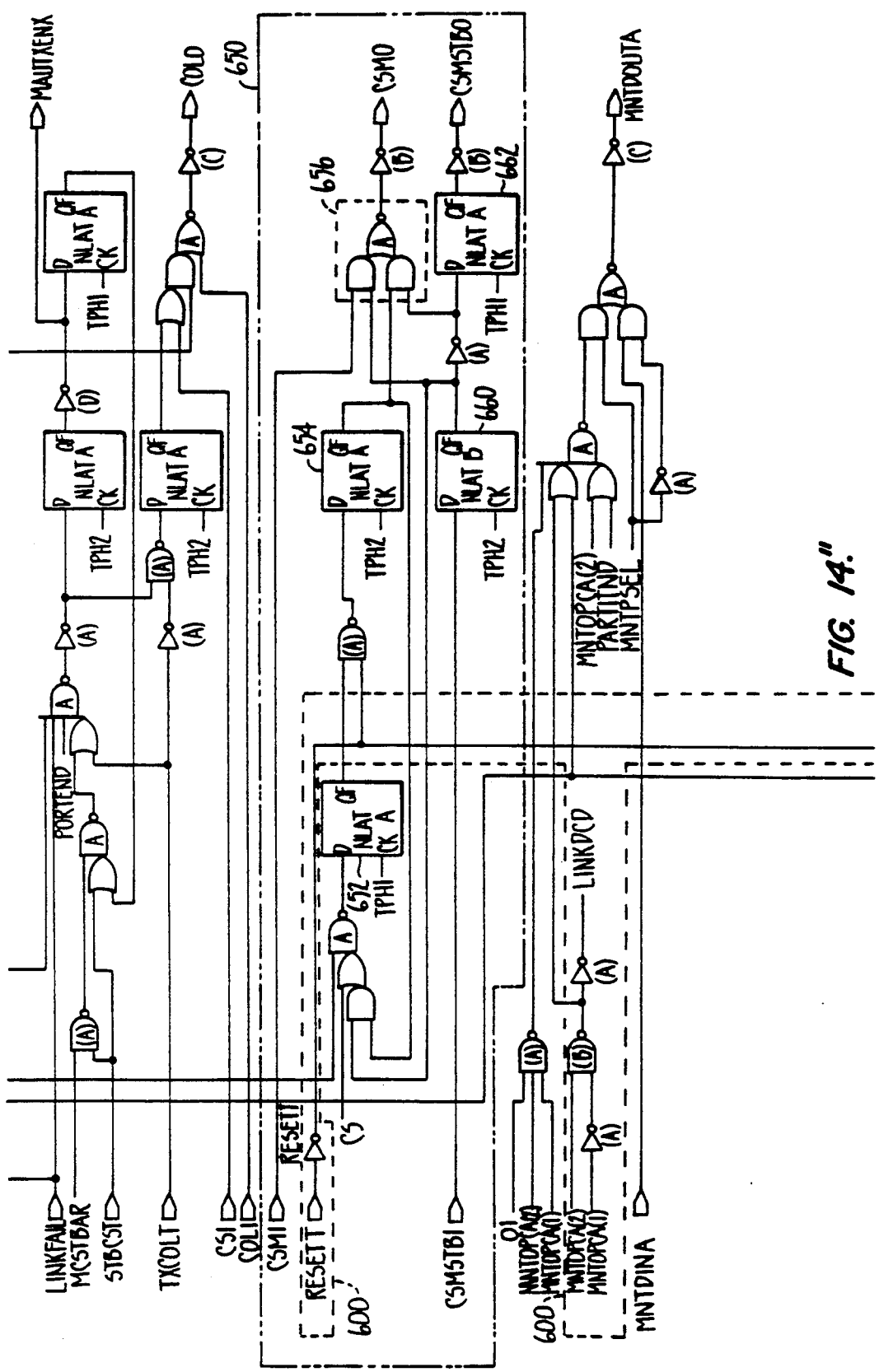
FIG. 14."

| FIG. 14' |
| FIG. 14'' |
| FIG. 14''' |

| FIG. 18A. | FIG. 18B. |
| --- | --- |
| FIG. 18C. | FIG. 18D. |

INTEGRATED MULTI-PORT REPEATER HAVING SHARED RESOURCES

This application is a continuation-in-part of Ser. No. 556,046, filed Jul. 20, 1990, and a continuation-in-part of Ser. No. 480,426, filed Feb. 15, 1990 now U.S. Pat. No. 5164,960. These applications are expressly incorporated by reference for all purposes.

BACKGROUND OF THE INVENTION

The present invention relates to computer communication network repeaters, and more specifically, the present invention relates to sharing resources of a repeater and a plurality of Medium Attachment Units integrated into a single integrated circuit device.

Prior art repeaters typically comprise multiple discrete devices for implementing an IEEE 802.3 Standard, this standard incorporated by reference for all purposes. The IEEE 802.3 Standard specifies a relay function and a port function. The repeater's purpose is to extend a local area network and to allow multiple nodes physically separated from each other to communicate with each other. The relay function receives a data packet from a first node at a first port with the data packet destined for another node at another port. Prior art repeaters may have almost any number of ports. The relay function retimes the data packet and restores proper amplitude to the received data packet. The repeater then retransmits the data packet to all its ports, and the proper node is able to respond. Prior art repeaters include a number of discrete ports which receive and transmit data as appropriate. The port function is different from the relay function.

Construction of the network may use different media types for transmission of a signal. These media include, for example, coaxial cable, shielded twisted pair cable and fiber optic cable. The different media types require different signal parameters to optimize performance of the network when using any particular medium. The network may also include a combination of medium types. The IEEE 802.3 Standard specifies general signalling characteristics and signal requirements for using these media. The general signal characteristics provide a convention for each node or repeater in presenting or receiving a signal to the network medium. A device referred to as a Medium Attachment Unit (MAU) translates the general signal information from a node or repeater to a medium specific signal. The MAU also translates the medium specific signal into the general signal. Thus, a repeater must have a MAU associated with each port. The MAU function is different than either the port function or the relay function.

A standard, IEEE 802.3 10BASE-T defines this translation function for a twisted pair medium, the standard hereby incorporated by reference for all purposes. Networks using twisted pair wiring have a star configuration, with a repeater as a hub of a star. Linking segments may interconnect a port of one repeater with another repeater port. A single node connects to the other ports of the repeater. Due to signal delays, there is a limit to a maximum number of repeaters through which a signal from a node may pass before receipt at a second node. This limit is four repeaters.

The MAU performs a number of functions that include implementation of a link integrity test (linktest) by generating idle linktest pulses (linkbeats). The IEEE 802.3 Standard also defines a Link Integrity Status feature incorporated into the MAUs. Each MAU must separately satisfy the requirements of the IEEE 802.3 Standard. The linkbeat requirements specify that a linkbeat must be received in a maximum predetermined interval, whose value may range between 50 ms and 150 ms. Additionally, the standard requires a minimum time interval between received linkbeats to elapse. Conventional systems use two timers to establish the necessary intervals to determine if a failure occurred and a third timer for generation of linkbeats. Each port requires three timers. Each MAU uses its own timers because each MAU's linkbeats are asynchronous relative to other linkbeats at the other MAUs.

MAUs constructed prior to the IEEE 802.3 Standard have not always provided for linkbeat generation. Some networks may use MAUs which do not generate linkbeats. Maintaining backward compatibility for newer MAUs (repeaters), added to such networks, is crucial. Thus, newer repeater units should not necessarily fail an older node (i.e. deactivate transmission and receive activity relative to the particular port coupled to the node) which does not generate linkbeats.

Another function a repeater performs is extracting data from an input signal. Extracting data from the data packets transmitted over the network by a repeater unit is necessary as the repeater unit retimes the data and provides the correct amplitude. The data packet encoding uses Manchester format which is a Boolean EXCLUSIVE OR combination of the data and the clock. To extract the data, a phase-locked loop first extracts the clock. A second EXCLUSIVE OR combination of the extracted clock and the Manchester formatted data extracts the data. This function is required for each of the ports in a repeater unit.

What is desirable is an integrated device combining the relay function with MAU and port functions simplifying construction of a repeater and reducing its costs. The integrated multi-port repeater (IMR) needs to include a number of ports, each with a MAU and perhaps an attachment unit interface (AUI). For an IMR having eight ports, for example, implementing the linkbeat and the data extraction requires 24 linkbeat timers and 8 phase-locked loop circuits. Reduction of this hardware is a desirable feature of the present invention. Additionally, maintaining backward linkbeat compatibility for repeater units added to networks existing before the linkbeat requirement is another feature of the present invention.

Repeater/hub management operations typically require that some external management system monitor activity of each repeater port to provide statistical information. This information may be used for accounting purposes, for example. An important signal in these management operations is the carrier sense signal. Assertion of carrier sense by a port indicates that the port is sensing activity on the network. Each MAU has an independent carrier sense signal. Integration of the MAUs into the IMR provides a situation in which access to the carrier sense signals of each of the MAUs by an external management system is difficult. A straightforward solution adds a pin for each carrier sense signal but this adds one pin per port per IMR chip. Integrated circuit pin limitations constrain this solution as chip cost is directly related to the number of pins. Therefore, it is a feature of the present invention to provide a streamlined mechanism to monitor port activity.

SUMMARY OF THE INVENTION

The present invention generally relates to an integrated multi-port repeater (IMR) that includes a plurality of MAUs wherein the IMR shares various resources among its ports. Specifically, the invention relates to an IMR having a single physical counter providing timing signals for determination of LINKBEAT status for a plurality of MAUs and which includes a programmable linktest state machine for each MAU controlling LINKBEAT reception. Additionally, the IMR incorporates a single phase-locked loop (PLL) for the plurality of MAUs as well as a serial port activity scan to monitor each MAU's carrier sense signal.

The IMR implements the single linkbeat counter by providing a single memory element, for example a master-slave (M/S) flip/flop, per function for a total of three memory elements associated with each port in the preferred embodiment, for example. Signals indicating port activity, such as a received linkbeat, clear the memory element while signals from the single physical counter set the memory element, as appropriate. Receipt of a timing signal when a particular memory element is set asserts a signal indicating a pass or a fail state, depending upon the particular function. Thus, a single counter working in conjunction with three memory elements associated with each port establishes linkbeat status in place of a multitude of timers.

The IMR implements the programmable linktest state machine by providing a test/management port for receipt of a particular control signal. A linktest state machine defaults, in the preferred embodiment, to a mode which generates linkbeats and which requires receipt of periodic Linkbeats, per the IEEE 802.3 Standard, to maintain the port's operation. A port which fails linktest, i.e. the port has not received a packet or proper linkbeat within the time window, enters a linktest fail state. A section of the IMR inhibits transmit and receive functions for any port in the linktest fail state. The linktest state machine associated with each port of the preferred embodiment of the present invention is responsive to a signal from the test/management port to disable LINKBEAT reception, while another independent section of the IMR continues to provide LINKBEAT generation.

The preferred embodiment of the present invention shares a single PLL for all the ports by providing the input of the PLL with a logical OR of all the data packet input signals. The occurrence of a collision causes the PLL to abort operation and reestablish a reference clock as its operation frequency. The collision condition is sufficiently long to permit the PLL to reestablish its operation at the reference clock frequency prior to receipt of additional data for decoding.

The preferred embodiment of the present invention incorporates a serial port activity scan function to monitor carrier sense signals for all the ports at a single pin. A second pin, strobe (STR), delineates a set of carrier sense signals for the ports. Each port has associated with it a memory element, such as a latch, for example, which is set in response to an assertion of a carrier sense signal for the particular port. The IMR performs a parallel-to-serial transformation of each register associated with each port to provide an indication of each port's activity during a previous sample period. The parallel-to-serial transformation also clears each register if the corresponding carrier sense signal is deasserted. A token passing mechanism operating through a daisy chain connection of the latches of each port enables the parallel-to-serial transformation.

Thus, the present invention shares resources of the IMR across the different ports. The resource sharing allows integration of the IMR in a simpler and more cost efficient manner. The resources shared include a linkbeat timer, a PLL and two pins for monitoring carrier sense activity. Additionally, a test/management port permits linkbeat reception to be selectively disabled or enabled for each port to ensure backward compatibility.

Reference to the remaining portions of the specification and the drawing realizes a further understanding of the nature and advantages of the present invention.

BRIEF DESCRIPTION OF THE DRAWING

FIG. 3 through FIG. 19 are diagrams of the functional and circuit diagrams of an IMR 50 according to a preferred embodiment of the present invention;

FIGS. 3, 3A, 3B, 3C are schematic diagram illustrating one example of an actual layout of the functional blocks in the IMR 50 identified in FIG. 2;

FIGS. 4, 4A, 4B are detailed schematic of a link counter 350 contained within the LINKTEST 328;

FIG. 5 is a detailed schematic of link control (LINKCTL) 352 of the LINKTEST 328 of FIG. 3;

FIGS. 6, 6A, 6B, 6C, 6D are block diagram of the MAUBANK 306 having a MAU port block (MAUPORT) 370 associated with each port;

FIG. 7 is a logic illustration of an operation of latches responsive to the COUT(x) signals for establishing the various windows of LINKTEST;

FIGS. 8, 8A and 8B are detailed schematic diagram implementing the FIG. 7 circuit for the TXLNKCKX input in the MAUPORT 370;

FIGS. 9, 9A, 9B, 9C and 9D are schematic block diagram of the STATUS 304 of FIG. 3;

FIGS. 10, 10A and 10B are schematic block diagram of an AUISTAT 502 of FIG. 9;

FIGS. 11, 11A and 11B are schematic block diagram of an MAUSTAT 500 of FIG. 9;

FIG. 12 is a detailed schematic diagram implementing the FIG. 7 circuit for the RXLNKWTX input in the RXLNKDET 556;

FIGS. 13, 13A, 13B and 13C are flow chart of the RXLNKSM 554 according to a preferred embodiment of the present invention;

FIGS. 14, 14', 14"and 14'" are detailed schematic diagram of the MAUCSDET 550 of FIG. 11;

FIGS. 15, 15A, 15B and 15C are circuit diagram of the AUICSDET 510 of FIG. 6;

FIG. 16 is a block diagram of the TESTPORT including a testport I/O (TESTIO) 750 and a test logic 752;

FIG. 17 is a schematic diagram of the TESTIO 750 illustrating the transformation of the CRST and STBT signals to the PADCRS and PADSTB signals respectively;

FIGS. 18, 18A, 18B, 18C and 18D are block diagram of the RXBCKEND 322 in the IMR 50;

FIG. 19 is a detailed schematic diagram of the CSMUX 804 according to a preferred embodiment of the present invention.

DETAILED DESCRIPTION OF A PREFERRED EMBODIMENT

Table of Contents
I. GENERAL
II. LINKTEST COUNTER
III. LINKBEAT RECEPTION DISABLING
IV. SERIAL PORT ACTIVITY SCAN
V. PHASE-LOCKED LOOP
VI. CONCLUSION

I. General

Figure 1:
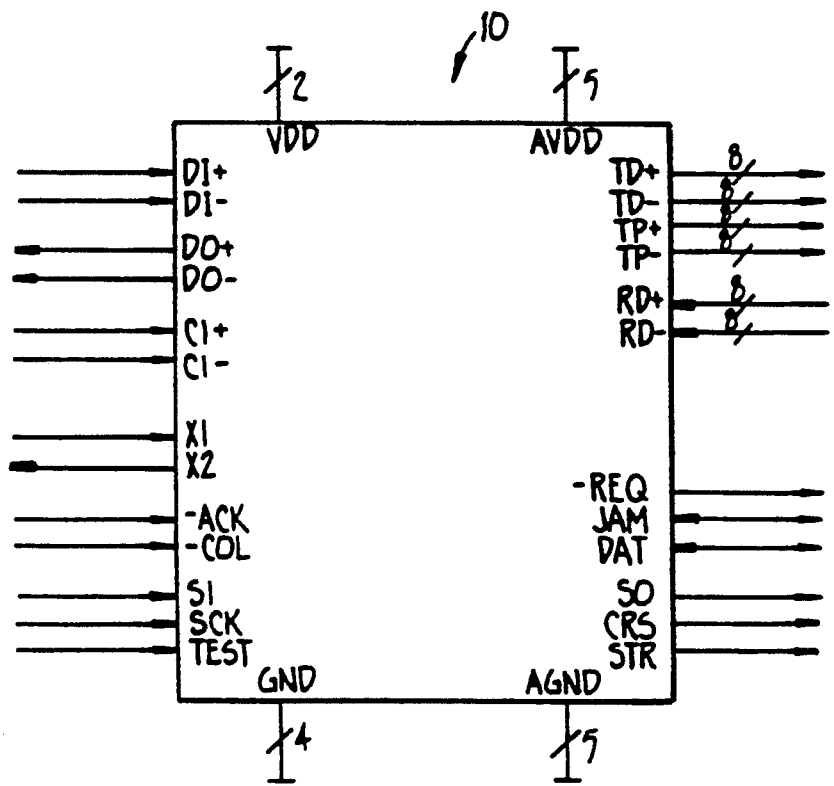
FIG. 1 illustrates one possible pin configuration of an integrated circuit (IC) device 10 embodying the present invention.

FIG. 1 illustrates one possible pin configuration of an integrated circuit (IC) device 10 embodying the present invention. The IC device 10 combines eight medium attachment units (MAUs) and an attachment unit interface (AUI). Each MAU uses one set of the lines TD+, TD−, TP+, TP−, RD+ and RD− as disclosed and further explained in the referenced and incorporated pending patent applications. The AUI includes the DI+, DI−, DO+, DO−, CI+ and CI− lines as also described in the incorporated patent applications.

The IEEE 802.3 Standard includes a description of a state machine flow specification outlining a minimum set of necessary functions of a repeater. A repeater unit must implement these functions of the IEEE 802.3 Standard. Not shown in FIG. 1 are the state machines of the IC device 10 which implement the repeater functions. One of these state machines, a linktest state machine, controls a linktest algorithm. The IEEE 802.3 Standard defines a standard linktest algorithm for generation and receipt of linkbeats. A repeater with embedded MAUs conforming to the IEEE 802.3 Standard should generate linkbeats at specified intervals in the absence of transmission activity. Additionally, each MAU of the repeater checks incoming linkbeats to ensure integrity of the network system. A period between successive linkbeats must pass both a minimum and a maximum period. Ports which fail linktest are prevented from participating in any transmission or reception of data, except for detecting receive activity or a series of linkbeats indicating a link is present. The linktest state machine participates in enabling a port upon detecting a link. Linkbeats which pass the timing requirements will reenable a port which has failed linktest. Conventional systems employ three timers per MAU, which for eight MAUs, as present on the IMR 50, means that 24 timers are necessary. A preferred embodiment of the present invention combines all the timers functions into a single physical counter that is interactive with various latches and state machines of each embedded MAU to greatly reduce the hardware required to implement the linkbeat function.

A preferred embodiment of the present invention also allows a repeater which conforms to the linkbeat requirements to nevertheless interact with a node which does not generate linkbeats. A repeater conforming to the IEEE 802.3 Standard deactivates a port connected to a node that does not generate linkbeats. To permit such a node to participate in the network, a preferred embodiment selectively disables or enables receive linktest function for the particular MAU.

Additionally, the preferred embodiment includes a mechanism to provide carrier sense information about each port to a device external the IC device 10 through use of two pins. Essentially, each port has associated with it a latch which stores a value indicating whether carrier sense was active during a particular period. A token circulates among the ports which queries the latches in succession to output the particular value of each latch. Thus, the latch information is provided in a serial fashion. The preferred embodiment also includes apparatus to share a phase-locked loop (PLL) among the different ports rather than including a PLL per port.

Four signals, serial input (SI), serial output (SO), serial clock (SCK) and test input control (TEST) are sections of a test and management control bus. These signals permit disabling or enabling of the receive linktest function of the IMR 50. SI is the Test/Management serial input port which permits communication of command and data signals to the IC device 10. SO is the Test/Management serial output port which supplies status data in response to test management commands. Rising edges of a signal on SCK clocks serial data on SI into the IC device 10. Assertion of TEST, active high, causes the IC device 10 to enter a serial scan test mode.

Figure 2:
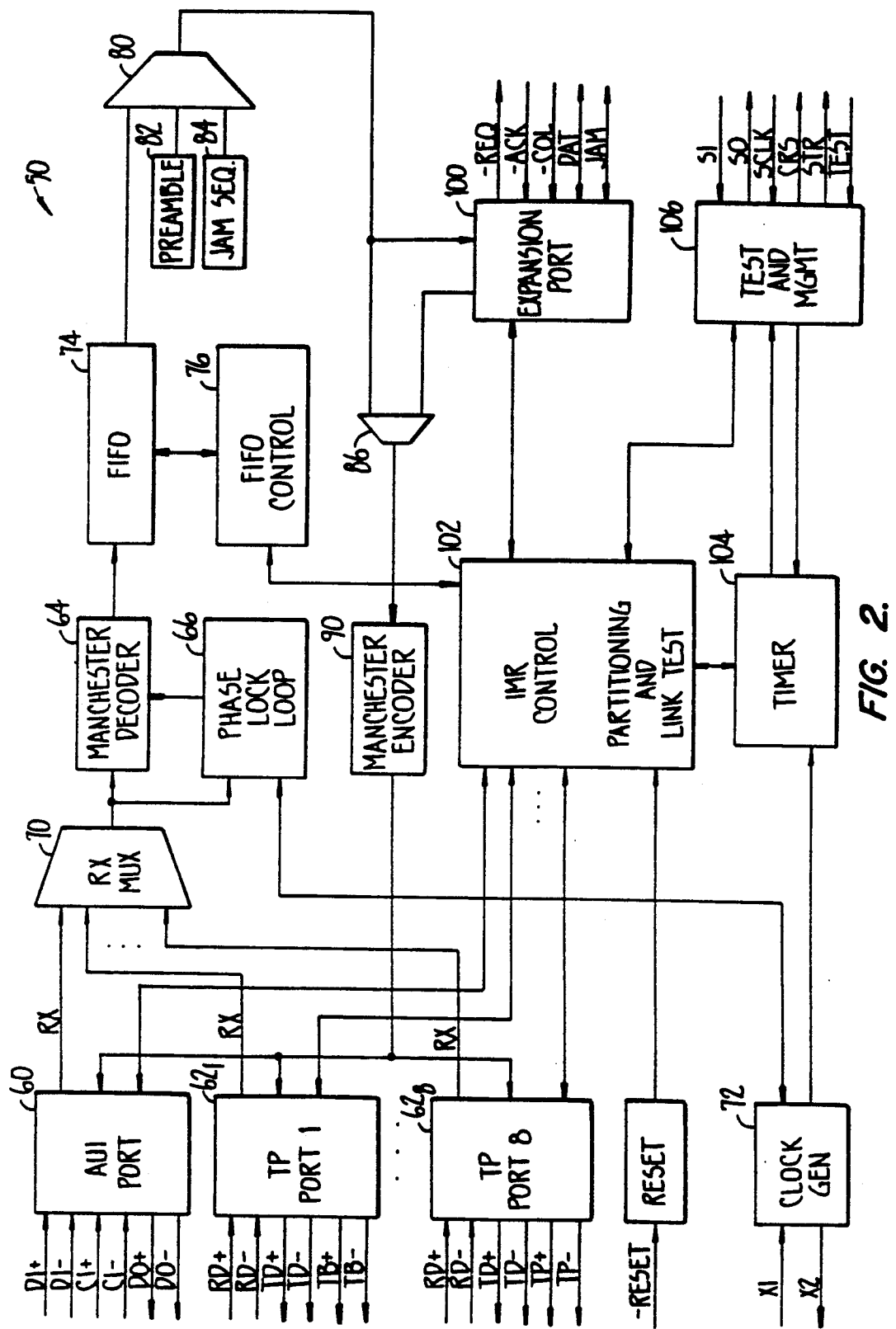
FIG. 2 is a block diagram showing a functional layout of an Integrated Multiport Repeater (IMR) 50 according to a preferred embodiment of the present invention.

FIG. 2 is a block diagram showing a functional layout of an Integrated Multiport Repeater (IMR) 50 according to a preferred embodiment of the present invention incorporated into the IC device 10. The IMR 50 includes a plurality of ports. An AUI port 60 and eight twisted pair ports $62_i$ couple the IMR 50 to a network. The twisted pair ports $62_i$ conform to the twisted pair standard and applicable portions of the IEEE 802.3 Standard. Each twisted pair port $62_i$ operates as a MAU. The twisted pair ports have a line for sending received data (RX) to a decoder 64 and a phase-locked loop 66 through a first multiplexer 70. The decoder 64 responds to the phase-locked loop 66 for extracting received data by use of an extracted timing clock embedded in the received signal. The phase-locked loop 66 uses an independent timing clock received from a clock generator 72 as a reference frequency. The clock generator 72 responds to an external clocking signal provided at inputs X1 and X2.

A first-in-first-out (FIFO) buffer 74 receives the decoded data from the decoder 64. FIFO control circuitry 76 manages reads from and writes to FIFO buffer 74. IMR 50 not only repeats received data to all appropriate ports, it also conditions the repeated data to be in proper protocol form. Using twisted pair cable allows many types of signal degradations, including timing delays, amplitude distortions and preamble truncations. The repeater strips the incoming data packet of its preamble and substitutes a standard preamble in it place. The repeater retimes and encodes the data with the clock generator 72 to be in proper Manchester form. It is possible that some timing mismatch occurs between the incoming data and the outgoing data because of differences in the clocks. The FIFO buffer 74 provides the necessary elasticity to allow the relatively independent operations of receiving data and repeating the conditioned data. The FIFO buffer 74 comprises one of the inputs into a second multiplexer 80. A preamble circuit 82 and a JAM sequencer 84 are also input into the multiplexer 80. A third multiplexer 86 outputs to an encoder 90. The encoder 90 encodes data received from the third multiplexer 86 and distributes it to the ports for sending to the various nodes. An output of the second multiplexer 80 provides data simultaneously to the third multiplexer 86 and to an expansion port 100. An output of the expansion port 100 also supplies data to the third multiplexer 86. The expansion port 100 exchanges information between intercoupled IMRs 50 through use of two bidirectional signals, DAT and JAM. An output signal REQ and two input signals ACK and COL combined with DAT and JAM establish an expansion bus connection.

An IMR control circuit 102 monitors and supervises operation of the IMR 50 in response to various control signals and data. The control circuit 102 contains partitioning and link test circuitry. The control circuit 102 uses various timers from timer circuit 104 and instructions from a test and management port 106 to oversee operation of the ports, the FIFO control circuit 76 and the expansion port 100. Timer circuits 104 are responsive to signals from the clock generator 72 and the test and management port 106.

FIG. 3 through FIG. 19 are diagrams of the functional and circuit diagrams of an IMR 50 according to a preferred embodiment of the present invention.

Figures 3, 3A:
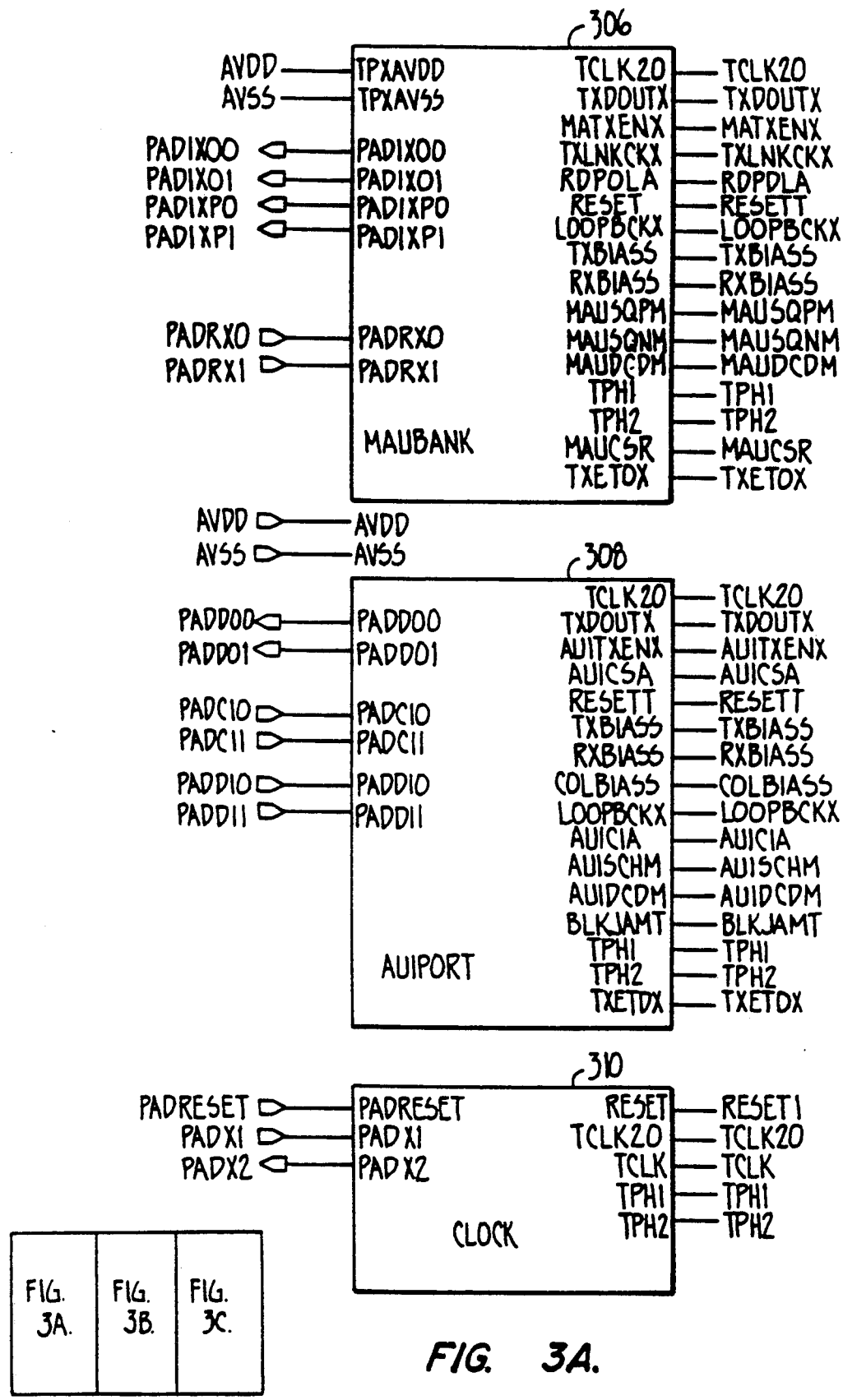
Figure 3B:
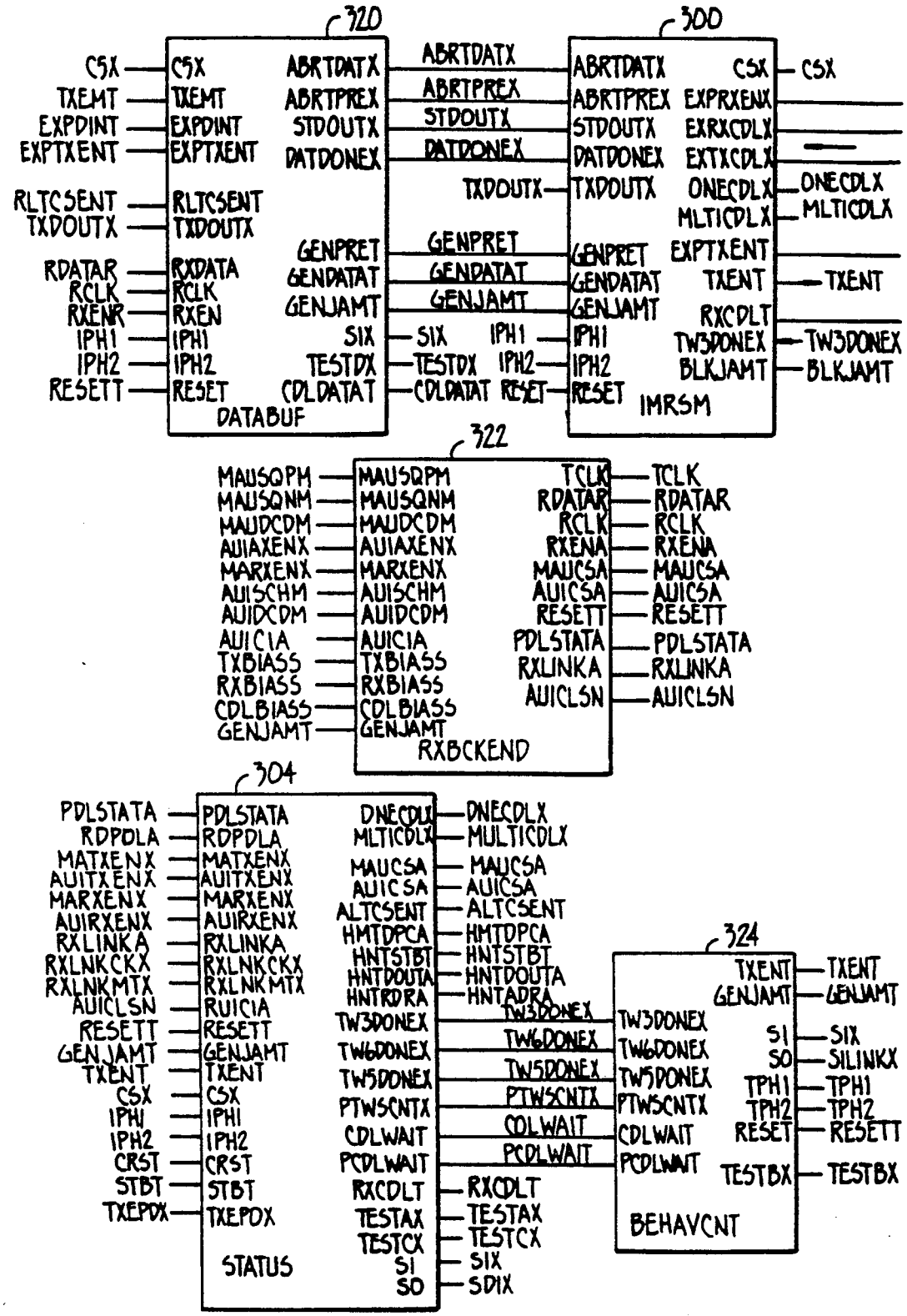
Figure 3C:
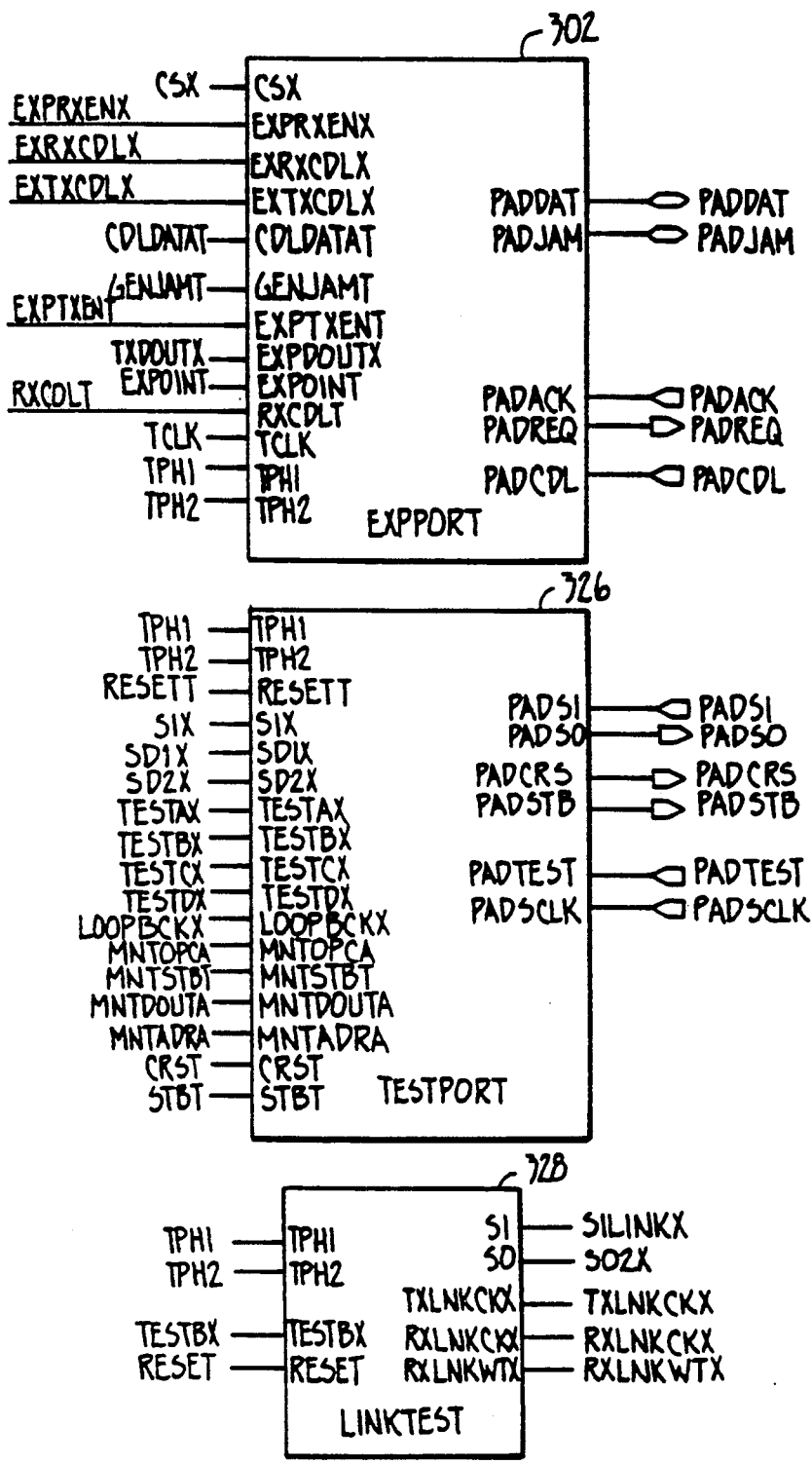

FIG. 3 is a schematic diagram illustrating an actual layout of functional blocks in the IMR 50. The IMR 50 includes the IMR state machine 300 receiving and sending signals primarily with respect to an expansion port (EXPPORT) 302 and a status (STATUS) 304 block. The EXPPORT 302 connects the IMR 50 to an expansion bus and includes connections for five expansion bus signals. A MAUBANK 306 and an AUIPORT 308 provide the ports for the IMR 50. A clock 310 function receives the external clock signals from the crystal oscillator 114 and receives any reset signal.

A data buffer (DATABUF) 320 supplies some signals to the IMR state machine 300 as well as the STATUS 304 and the EXPPORT 302. The IMR 50 includes a receiver back end (RXBCKEND) 322 and a behavior counter (BEHAVCNT) 324 which monitors collision duration and jabber function. A test port (TESTPORT) 326 and linktest timer (LINKTEST) 328 complete the functional blocks of the IMR 50. An AUISTAT 502 (See FIG. 9) in the STATUS 304 contains an AUICSDET 510 (See FIG. 10), and a MAUSTAT 500 in the STATUS 304 contains a MAUCSDET 550. Both are responsive to control signals from the TESTPORT 326. A linktest state machine (RXLNKSM 554 in FIG. 11) is responsive to the test port programming of the MAUCSDET 550. The implementation of the control mechanism is one example of controlling disablement of receive linktest function. In the preferred embodiment, a particular bit pattern, "0 1 0 0 0 ###", clocked into SI by SCK programs the MAUCSDET 550 to disable the receive linktest function for a MAU, identified by ###. The bit pattern "0 1 0 1 0 ###" enables linktest reception for the identified MAU. The TESTPORT 326 receives the bit pattern at PADSI and outputs management and test opcodesasynchronous (MNTOPCDA), management and test addressesasynchronous (MNTADRA), and a management and test strobe (MNTSTBT) to the STATUS 304.

A plurality of timers in the BEHAVCNT 324 influence operation of the function, as well as collision and activity information developed from the ports, the MAUBANK 306 and the AUIPORT 308.

A partition state machine, for example PARTSM in FIG. 552, determines collision activity, collision status and alternate partition/reconnection algorithm programming of the ports by use of the MAUCSDET 550 and the AUICSDET 510 in the STATUS 304. Combining this activity and collision information with timing information from the BEHAVCNT 324 implements the partition state machine. An active twisted pair port is a twisted pair port that is either receiving data or transmitting data. An active AUI port is an AUI port for which a data in (DI) circuit senses a carrier signal. The MAUCSDET 550 determines collisions for the twisted pair ports by noting instances when transmit and receive activity for a particular port overlap. For the AUI port, an active collision in (CI) indicates a collision.

II. Linktest Counter

The IEEE 802.3 Standard identifies a linktest function which both disables a port failing linktest integrity test (LINKTEST) and enables a port which indicates successfully that passes LINKTEST, referred to later as LINKPASS. LINKPASS, which is port specific, requires that a port receive a linkbeat within a particular window, as described above. The window has a minimum and a maximum. Additionally, each port must periodically generate linkbeats. A linktest state machine disables a port which fails LINKTEST. Upon failure of the LINKTEST, the linktest state machine monitors for receive activity or a series of linkbeats, each linkbeat within the window. To successfully manage this task, many conventional systems employ multiple timers or counters per port to measure these time intervals. The present invention combines these various timing functions of all the ports into a single physical counter which interacts variously with one or more latches or a state machine to satisfy the LINKTEST requirements.

Figure 4A:
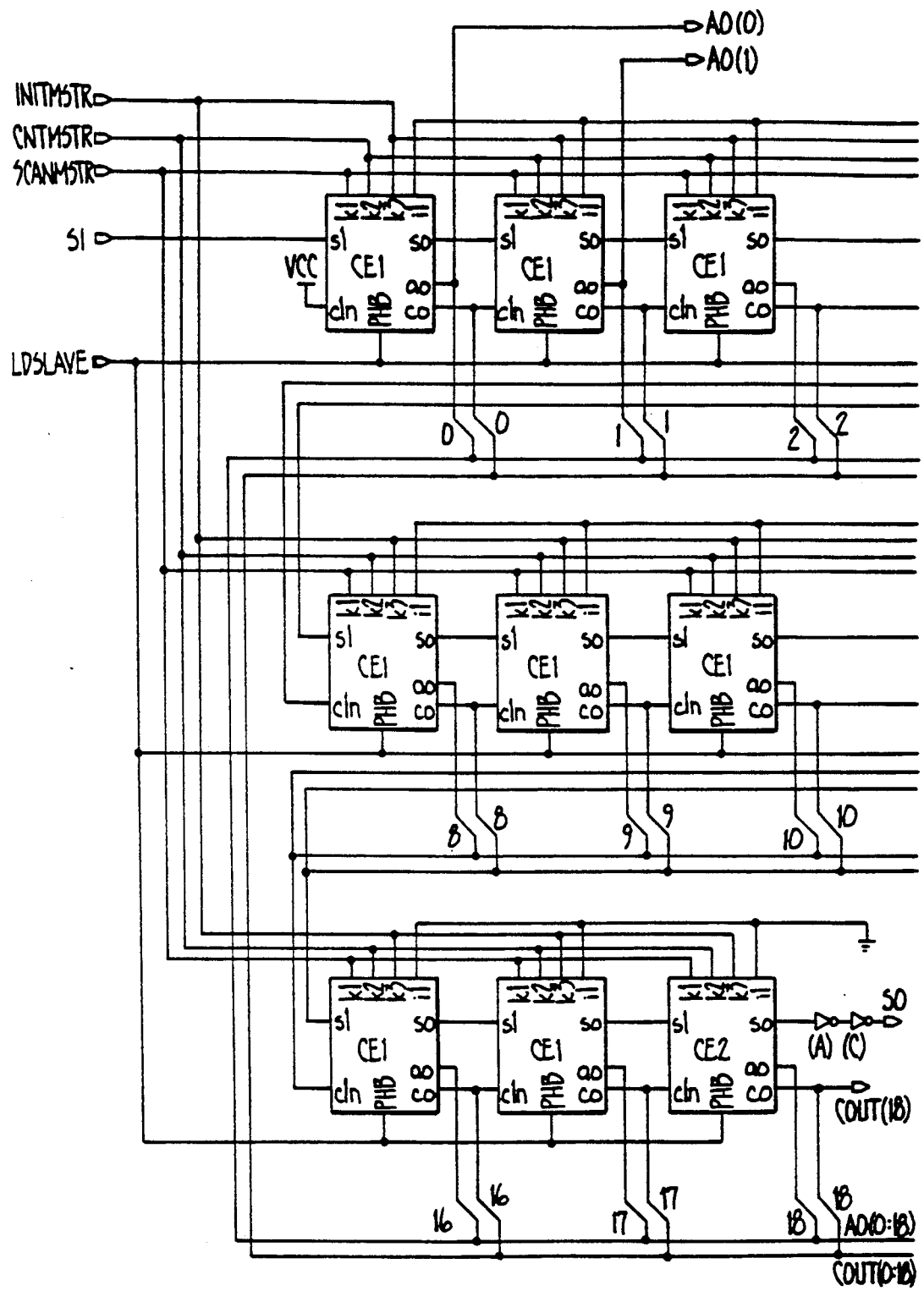

FIG. 4 is a detailed schematic of a link counter 350 contained within the LINKTEST 328. The LINKTEST 328 receives two non-overlapping 10 megahertz clocks, TPHI and TPH2 and generates three linktest control signals, receive link wait (RXLNKWTX), transmit link clock (TXLNKCKX) and receive link clock (RXLNKCKX). The LINKCNT 350 is an 18-bit counter that generates a plurality of carryout signals (COUT(x)), one from each bit position. The LINKCNT 350 COUT(x) pulse is a function of x and of an input clock frequency. Generally, for a clock having a frequency of $F_{ck}$, COUT(x) produces a pulse every $2^{x+1}/F_{ck}$ seconds. For three particular values of x in COUT(x), namely 13, 15 and 18, the LINKCNT 350 produces pulses every 1.6 milliseconds, 6.4 milliseconds and 52.4 milliseconds, respectively. The LINKTEST time windows include: a) transmitting a linkbeat whenever a transmitter has been inactive for a period of more than approximately 16 (+/−8) milliseconds, b) monitoring to ensure that a port does not receive a linkbeat no sooner than 2–7 milliseconds after an immediately preceding linkbeat or receive activity, and c) monitoring to ensure that a linkbeat or a receive activity occurs no longer than 100 (+/−50) milliseconds after an immediately preceding linkbeat or receive activity. The values of COUT(15), COUT(13) and COUT(18), respectively, approximate these windows. The preferred embodiment of the present invention adjusts the actual values of COUT(15), COUT(13) and COUT(18) by multiplying the values by 1.25. This multiplication, as is well known, may be accomplished simply by counting only 4 of every 5 input clock pulses. Thus, the actual approximate values of COUT(13), COUT(15) and COUT(18) are 2.05 milliseconds, 8.20 milliseconds and 65.5 milliseconds, respectively. These values fall within the window required by IEEE 802.3.

Figure 5:
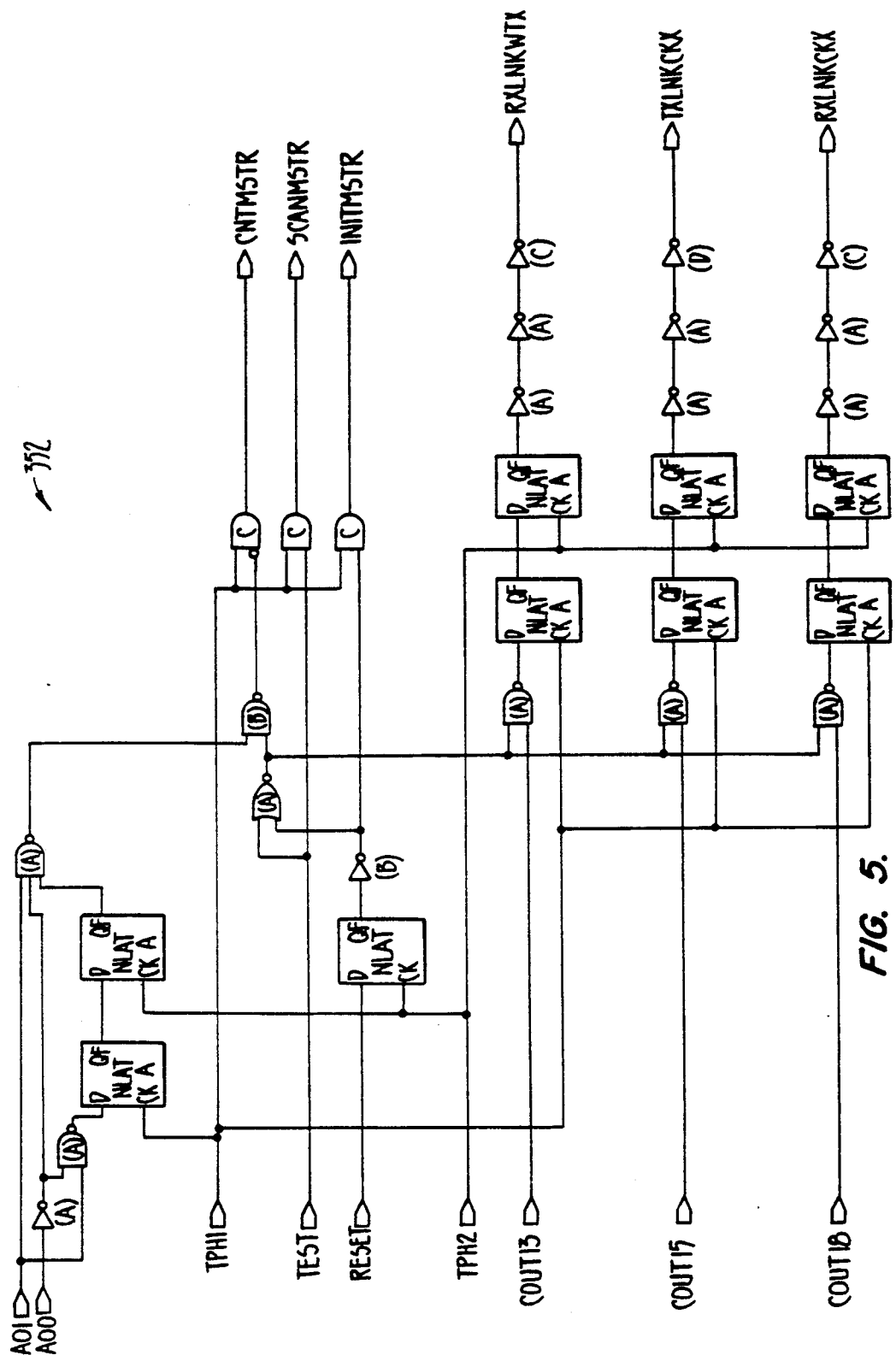
Figure 6A:
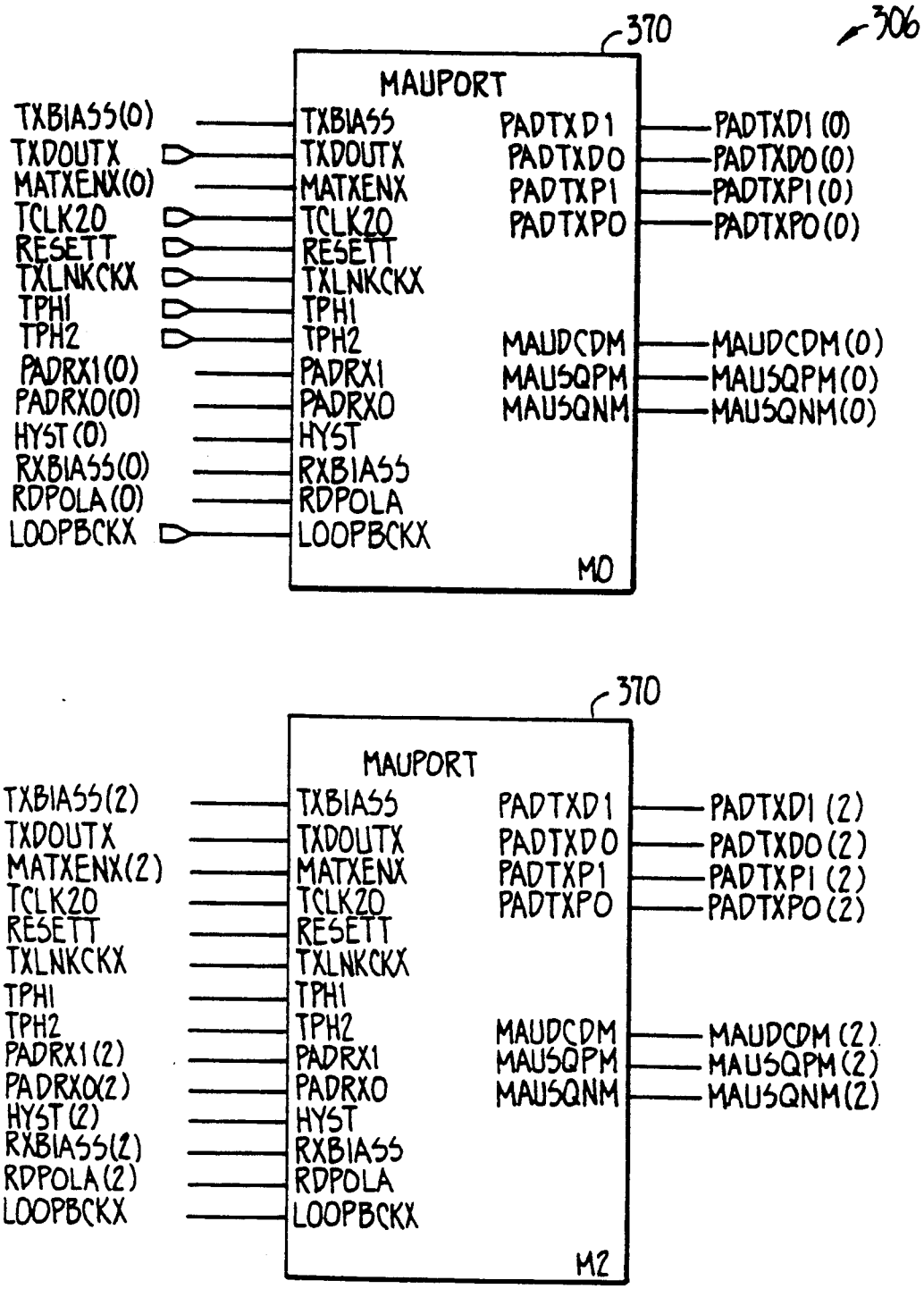
Figure 6B:
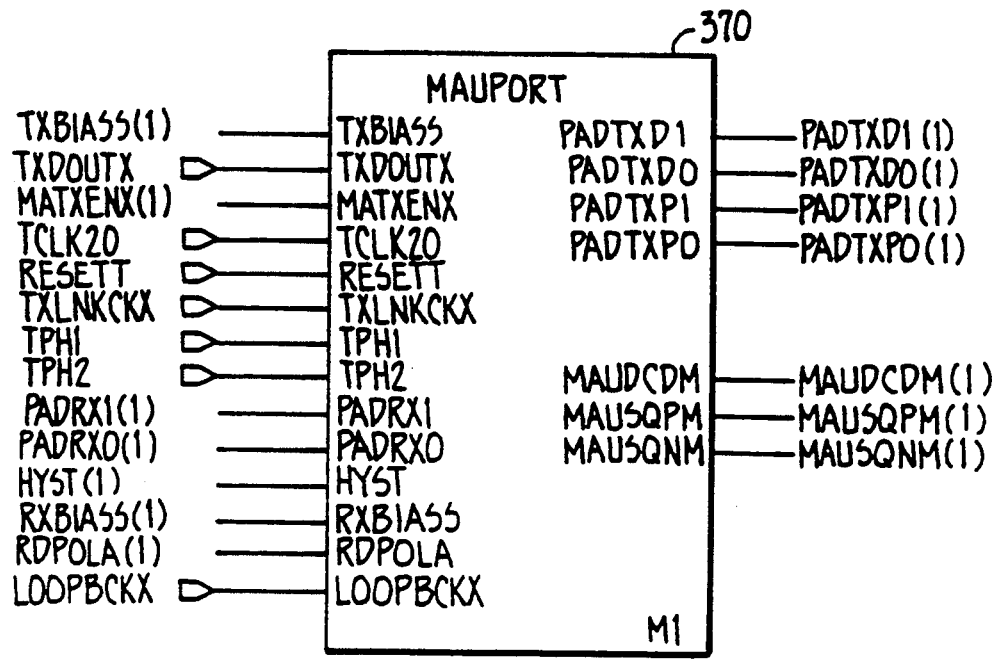
Figure 6B:
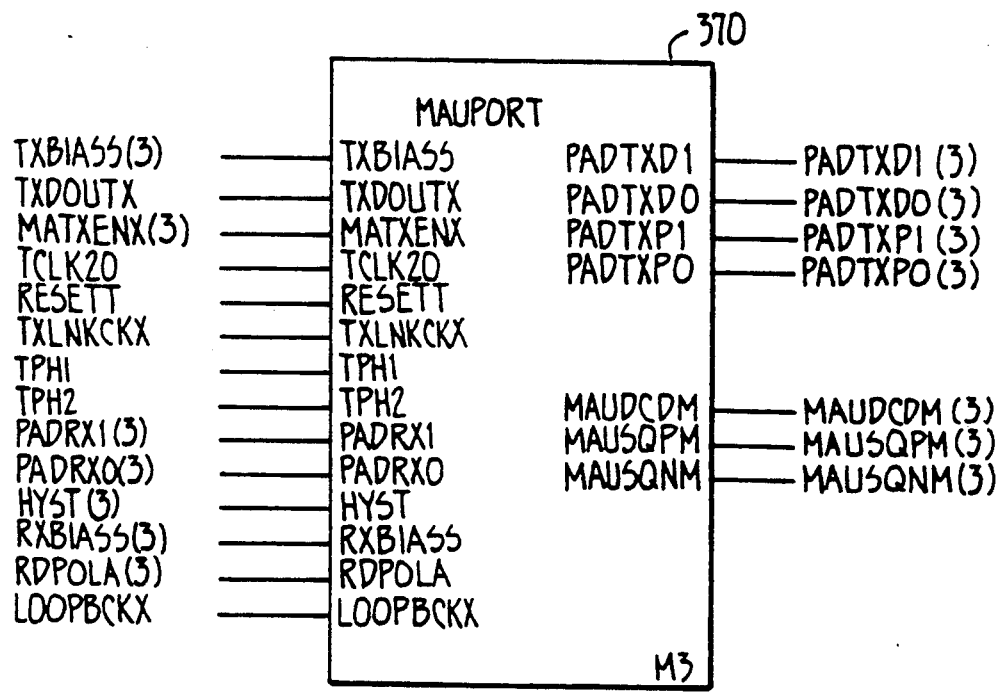
Figure 6D:
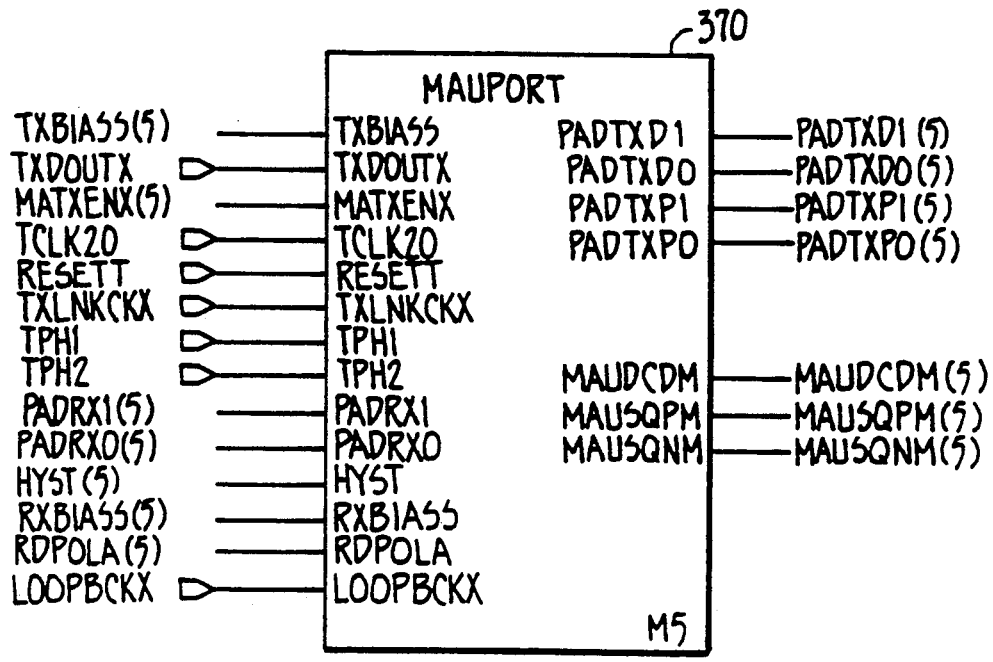
Figure 6D:
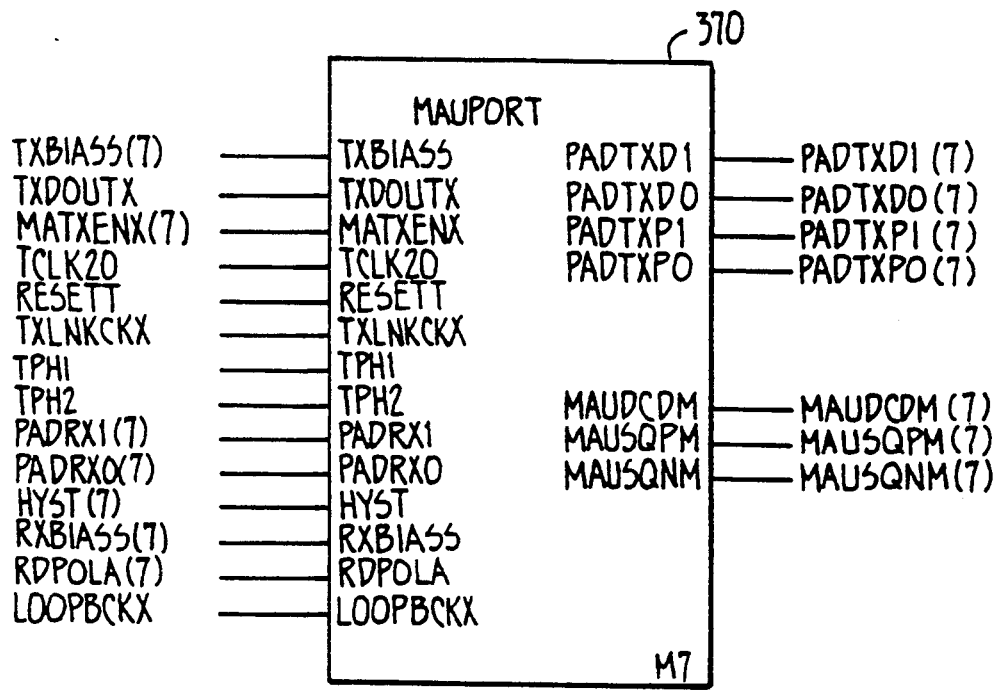

FIG. 5 is a detailed schematic of link control (LINKCTL) 352 of the LINKTEST 328 of FIG. 3. A plurality of inverting level sensitive latches (NLATs) receive the COUT signals and clock them to an output as indicated. The NLAT has two inputs and an output. Assertion of a clock signal at a CK input inverts data appearing at a first input (D input) and provides it to the output. Thus, COUT(13) corresponds to the RXLNKWTX signal, COUT(15) corresponds to the TXLNKCKX signal and COUT(18) corresponds to the RXLNKCKX signal. The NLATs and the inverters delay and buffer the signal appropriately.

FIG. 6 is a block diagram of the MAUBANK 306 having a MAU port block (MAUPORT) 370 associated with each port. Each MAUPORT 370 receives 5 signals which controls that port's transmission of a linkbeat. These signals include TPH1, TPH2, reset (RESETT), TXLNKCKX and MAU transmit enable (MATXENX). Assertion of the MATXENX by the STATUS 304 to a particular port enables that port to transmit a packet. Thus, the MAUPORT 370 is able to use the MATXENX signal as an indication that the port is in the process of transmitting data.

Figure 7:
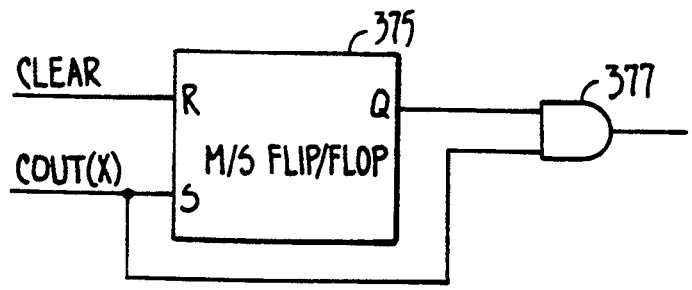

FIG. 7 is a logic illustration of an operation of latches responsive to the COUT(x) signals for establishing the various windows of LINKTEST. Conceptually, a preferred embodiment of the present invention may be understood by reference to the circuit of FIG. 7. A master/slave (M/S) R-S flip/flop 375, as well understood in the art, deasserts an output Q upon an assertion of a pulse at a reset input R. The flip/flop 375 asserts the Q output upon an assertion and subsequent deassertion of a signal coupled to a set input S. A logical product (AND) gate 377 receives the Q output of the flip/flop 375 at one input and the input to the S input of the flip/flop 375 at another input.

In operation, a circuit asserts CLEAR at the R input, clearing the flip/flop 375 and deasserting an output of the AND gate 377. The output of the AND gate 377 indicates if a particular timing window has been satisfied. For COUT(15), the LINKTEST 328 will assert the S input from anywhere from immediately to approximately 8.2 milliseconds after deassertion of CLEAR. The assertion and subsequent deassertion of COUT(15) sets the Q output of the flip/flop 375. Thereafter, either the circuit asserts CLEAR or, about 8.2 milliseconds later, the LINKTEST 328 asserts the COUT(15) again. Assertion of CLEAR before COUT(15) will deassert the output Q of the flip/flop 375, preventing assertion of the output of the AND gate 377. In this case, this means that the circuit asserted CLEAR within a window less than twice the period between successive pulses of the COUT(15). In this case, the window is about 8.2 milliseconds to 16.4 milliseconds, within the window of 16 (+/−8) set by the standard. However, if the LINKTEST 328 asserts COUT(15) while the flip/flop 375 asserts its Q output, the AND gate 377 will assert its output due to previous assertion and subsequent deassertion of COUT(15). The assertion of the AND gate 377 indicates receipt of successive pulses of COUT(15) without an intervening assertion of CLEAR. What happens as a result of an assertion of the AND gate 377 depends upon the particular application. For COUT(15) (i.e. TXLNKCKX), the circuit asserts CLEAR after a hardware system reset or upon transmission from a particular port. The IEEE 802.3 Standard requires that the MAU transmit a linkbeat within approximately 16 (+/−8) milliseconds after some transmission from the MAU, either packet transmission or linkbeat. Thus, assertion of the AND gate 377 output initiates generation of the linkbeat from the MAU.

Similarly, for COUT(13), (i.e. RXLNKWTX), the circuit asserts CLEAR with every received linkbeat. The IEEE 802.3 Standard requires that a minimum time of 2-7 milliseconds lie between the successive received linkbeats. Thus, an assertion of the AND gate 377 output indicates that the minimum duration was reached, i.e. that the flip/flop 375 received two successive COUT(13) pulses without receipt of a linkbeat.

The preferred embodiment of the present invention uses a receive link state machine (RXLNKSM) in lieu of a circuit of FIG. 7 for COUT(18). The IMR 50 could use a circuit such as that in FIG. 7 to monitor a maximum time for transmit activity. In that instance, the circuit asserts CLEAR whenever the MAU receives either packet data, linkbeat or collision signal. Successive assertions of COUT(18), (i.e. RXLNKCKX) without assertion of CLEAR indicates that more than 100 (+/−50) milliseconds have elapsed and that LINKTEST has failed.

Figures 8, 8A:
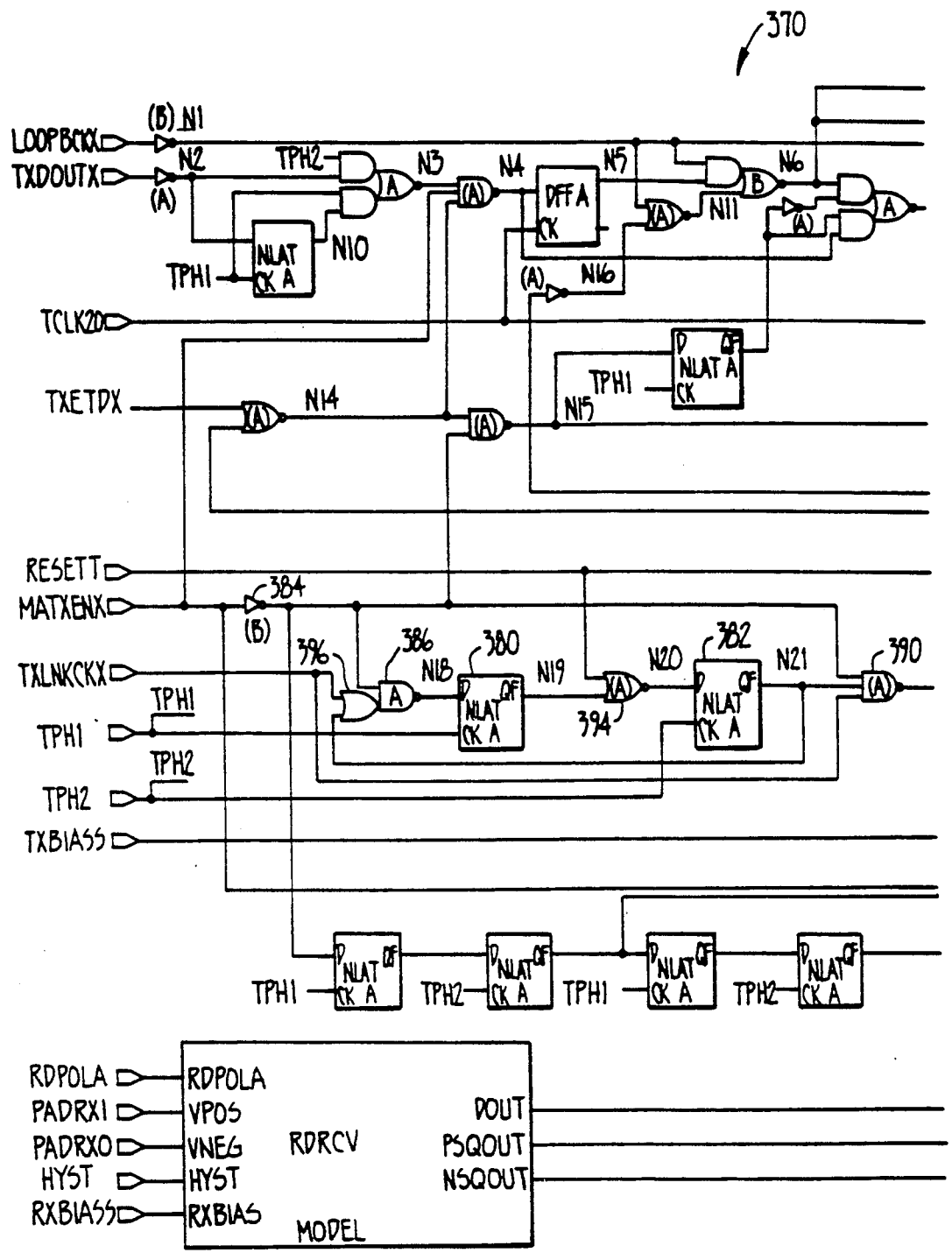
Figure 8B:
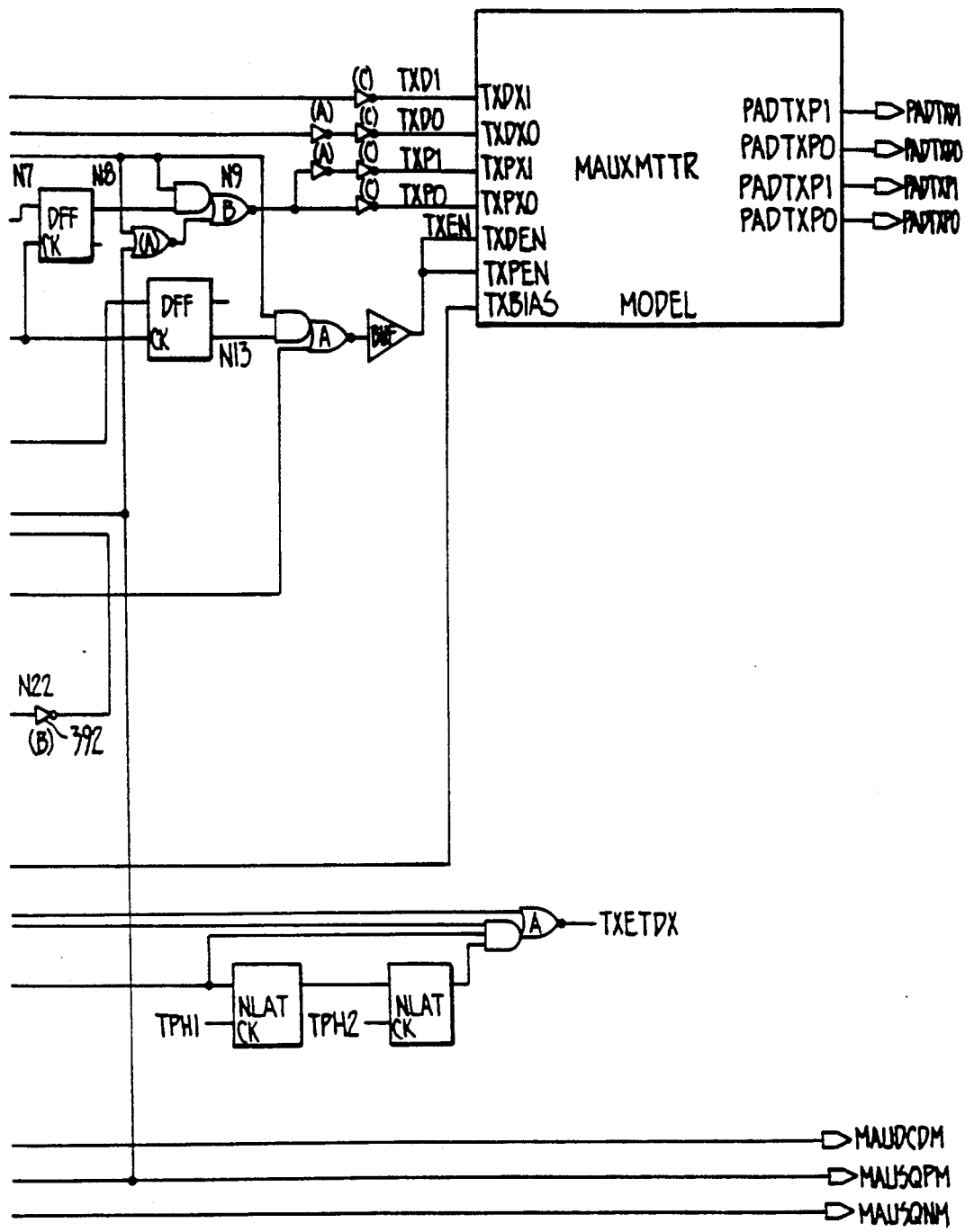

FIG. 8 is a detailed schematic diagram implementing the FIG. 7 circuit for the TXLNKCKX input in the MAUPORT 370. MATXENX corresponds to the CLEAR described with respect to FIG. 7 and COUT(15). A pair of NLATs, NLAT 380 and NLAT 382 provide one embodiment for a latch function described in FIG. 7 for the flip/flop 375. The NLAT 380 operates in response to assertions of TPHI at the CK input while the NLAT 382 is responsive to assertions of TPH2 at its CK input. An invertor 384 receives MATXENX at an input. A dual input NAND gate 386 receives an inverted MATXENX from an output of the invertor 384. A triple input NAND gate 390 also receives the inverted MATXENX signal from the invertor 384. An input of an invertor 392 receives an output signal from the NAND gate 390. An assertion of an output of the invertor 392 initiates linkbeat generation by the MAU.

The data input of the NLAT 380 receives an output signal from the NAND gate 386. A dual input NOR gate 394 receives the output of the NLAT 380 at one input. The NOR gate 394 receives RESET at another input and provides an output signal to the input of the NLAT 382. The NAND gate 390 receives the output of the NLAT 382. Additionally, a dual input OR gate receives the NLAT 382 output at one input and TXLNKCKX at the other input. The NAND gate 386 receives an output of the OR gate 396 at an input.

In operation, starting with RESETT, MATXENX and TXLNKX deasserted, an assertion of RESETT deasserts the input to the NLAT 382, thereby asserting the output upon an assertion of the TPH2. The invertor 384 asserts its output to the NAND gate 390, which is prevented from asserting the invertor 392 output by the deassertion of the TXLNKCK. Thereafter, OR gate 396 asserts its output to the input of the NAND gate 386. The assertion of RESETT maintains the system in this configuration. The NAND gate 386 deasserts its output to the NLAT 380 which subsequently asserts the NLAT 380's output upon an assertion of TPHI. This is the set condition of the NLATs 380 and 382.

An assertion of MATXENX deasserts an input of the NAND gate 386 and deasserts the output of the invertor 392, thereby inhibiting generation of a linkbeat. This assertion does not alter the clear condition of the NLATs if they were clear (i.e. this assertion clears the NLATs). Subsequent deassertion of the MATXENX results in assertion of an input to the NAND gate 386 and NAND gate 390. Assertion of TXLNKCKX sets the NLATs by deasserting the input to the NLAT 380. This asserts the output, with appropriate timing delays, of the NLAT 382. The invertor 392 remains deasserted as deassertion of TXLNKCKX before assertion of the output of the NLAT 382 results in deassertion of an input of NAND gate, maintaining the invertor 392 deasserted. However, the NLATs are now set. A subsequent assertion of MATXENX will assert the input of the NLAT 380, clearing the NLATs. An assertion of TXLNKCKX while the NLATs are set results in assertion of all the inputs of the NAND gate 390, thereby asserting the output of the invertor 392, which initiates generation of a linkbeat.

Figure 9A:
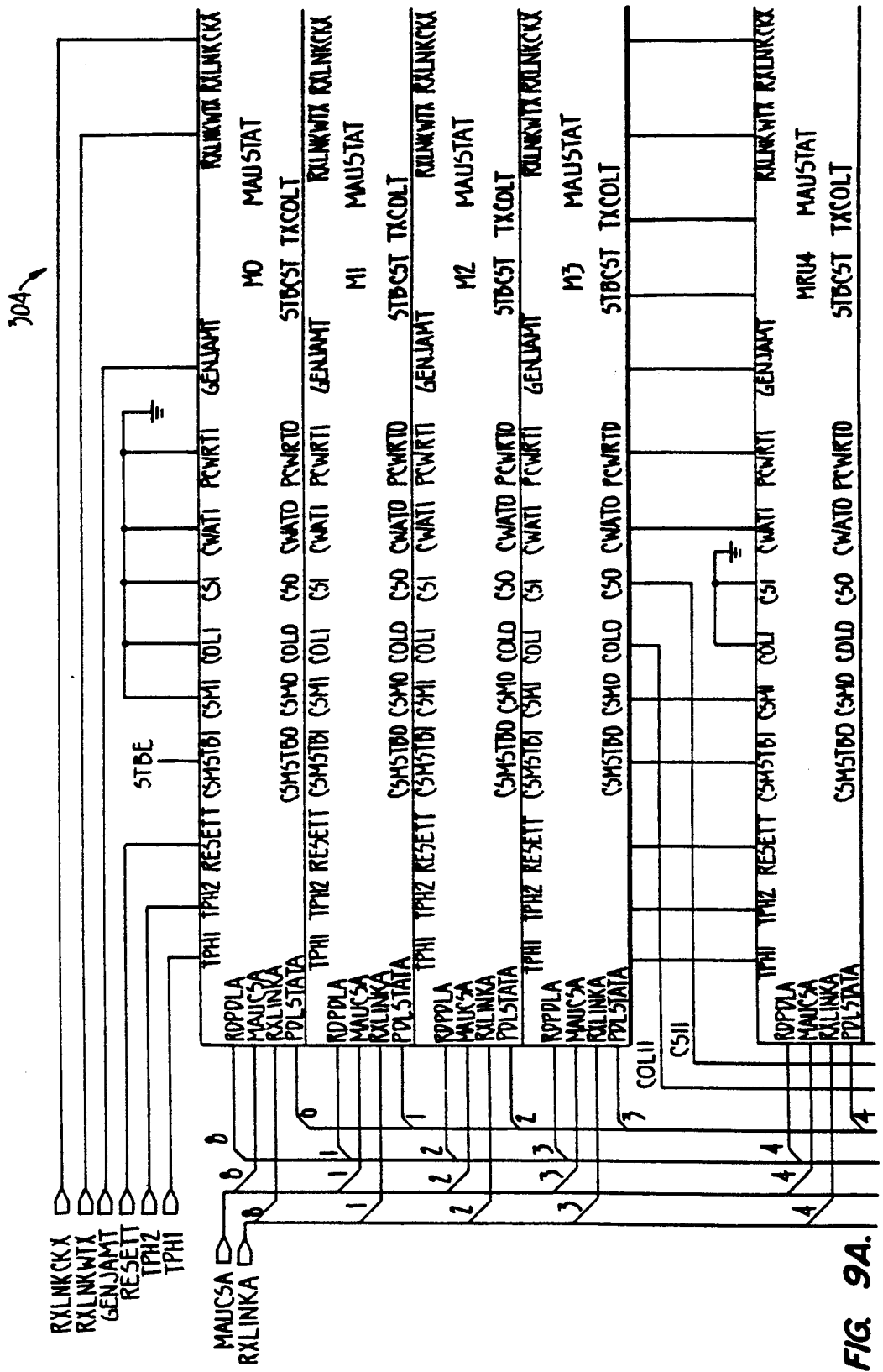
Figure 9C:
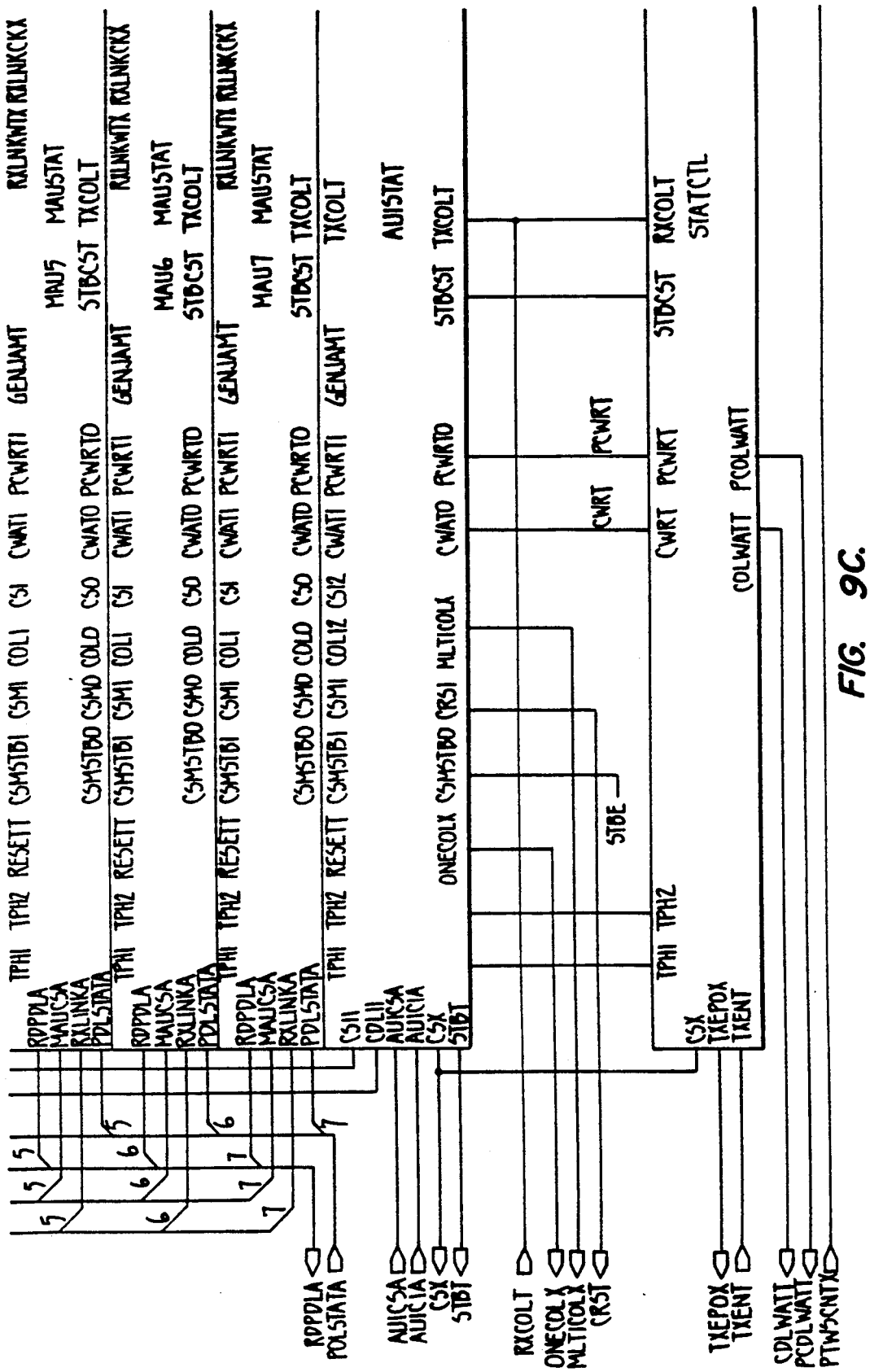
Figure 9D:
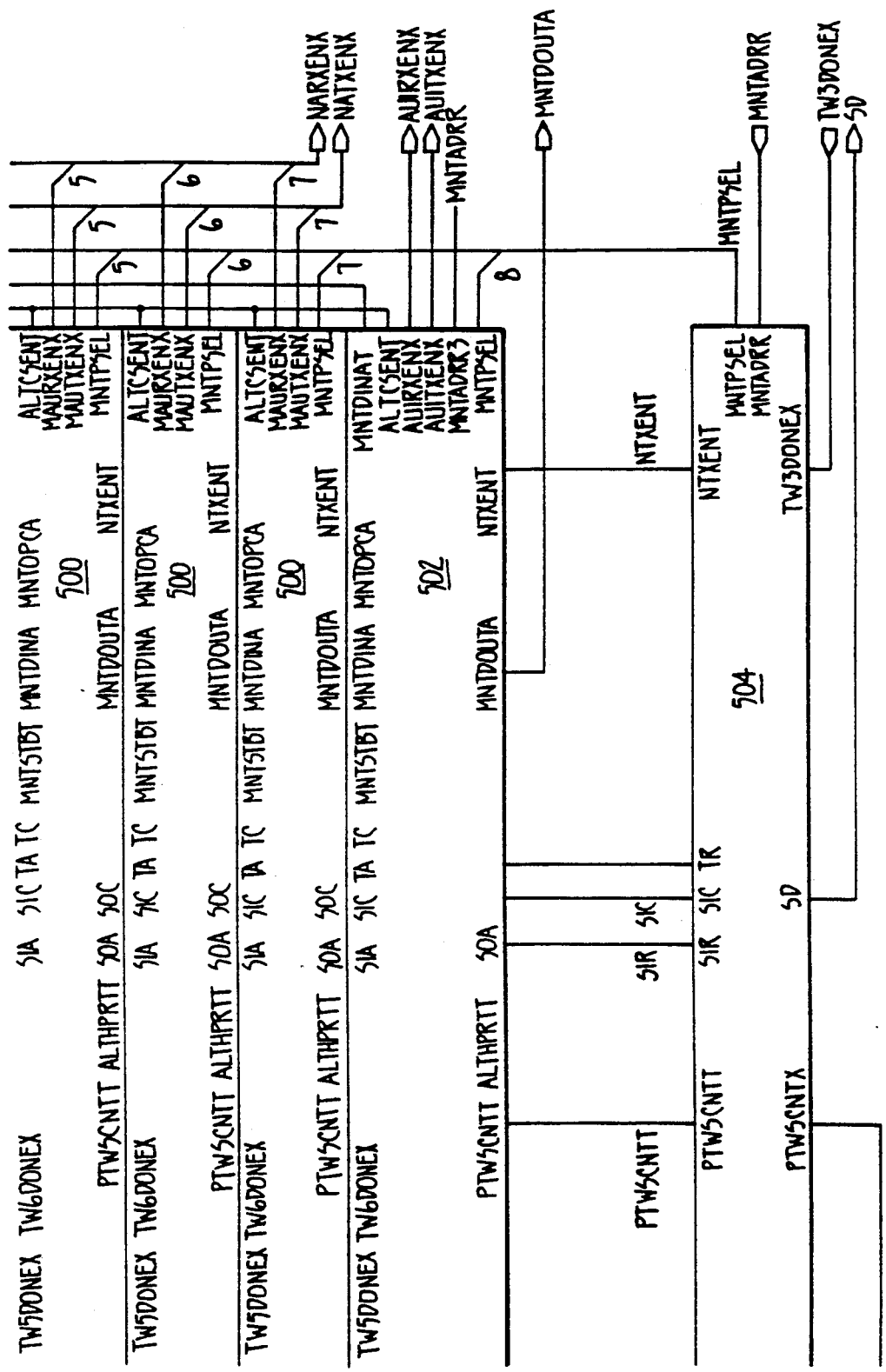

FIG. 9 is a detailed block diagram of the STATUS 304. The STATUS 304 operates in relation to the signals from the IMRSM 300 to particularize the IMR for the number and type of ports. The IMRSM 300 is unaware of the particular type of ports and their number. The STATUS 304 block monitors the activities of the individual ports to identify ports which are receiving, and which are transmitting. The STATUS 304 also modifies enabling signals directed to the ports to deselect particular ports, for example to disable a transmit enable to a receiving port. The STATUS 304 comprises a MAU status circuit (MAUSTAT) 500 for each MAU port of the IMR 50 and an AUI status circuit (AUISTAT 502) for the AUI port. A status control (STATCTL) 504 controls operation of the MAUSTAT 500 circuits and the AUISTAT 502 circuit. The STATUS 304 receives TXENT, GENJAMT, ALTCSENT, TW3DONEX, RXCOLT, RESETT, TPH1, and TPH2, among other signals. The STATUS 304 produces a plurality of signals, including CSX, ONECOLX and MLTICOLX. A plurality of MAU status (MAUSTAT) circuits 500, one per twisted pair port, provide status information from each port and control information to its associated port. Similarly AUI status (AUISTAT) 502 provides status information and control information concerning the AUI port.

Figures 10, 10A:
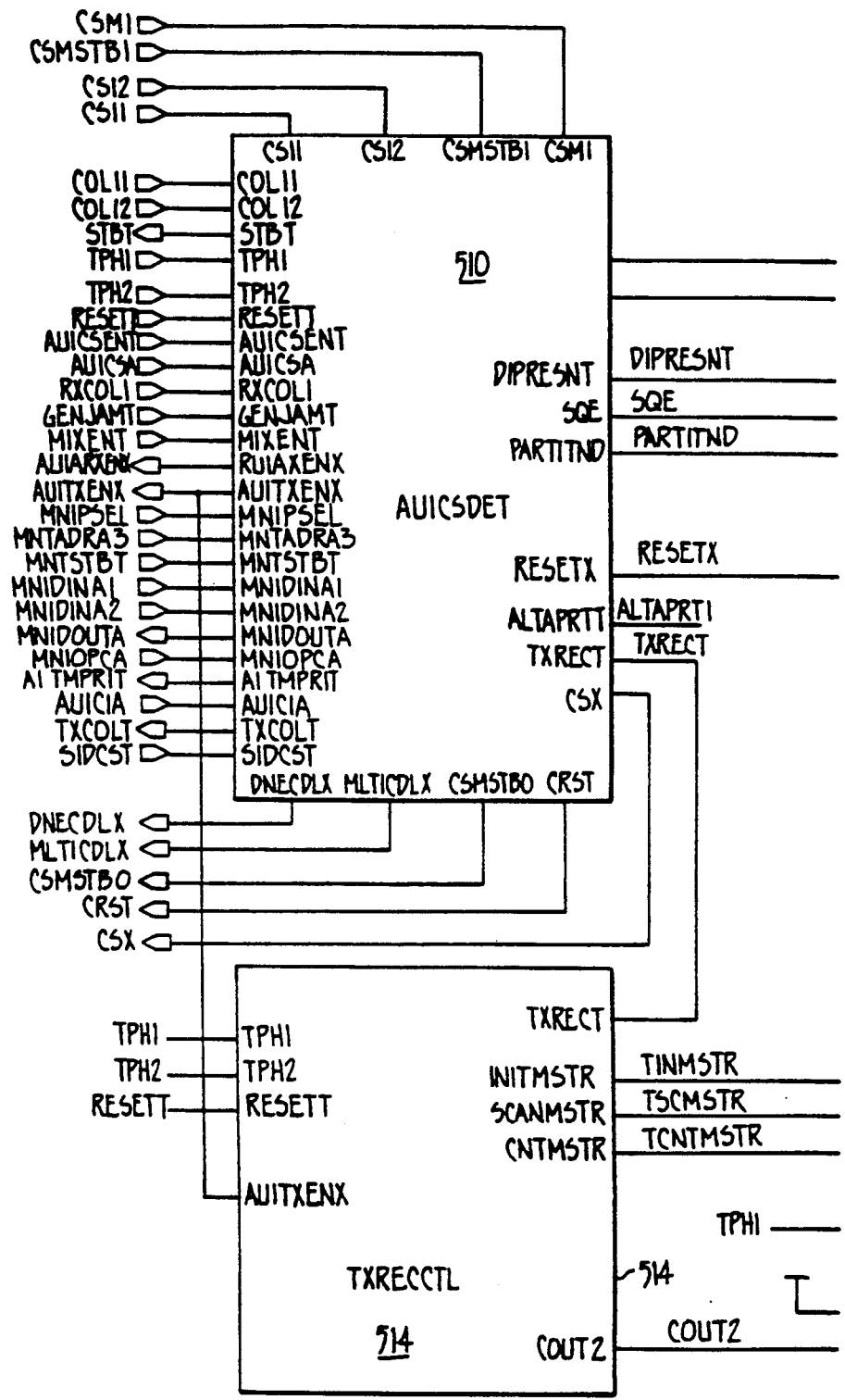
Figure 10B:
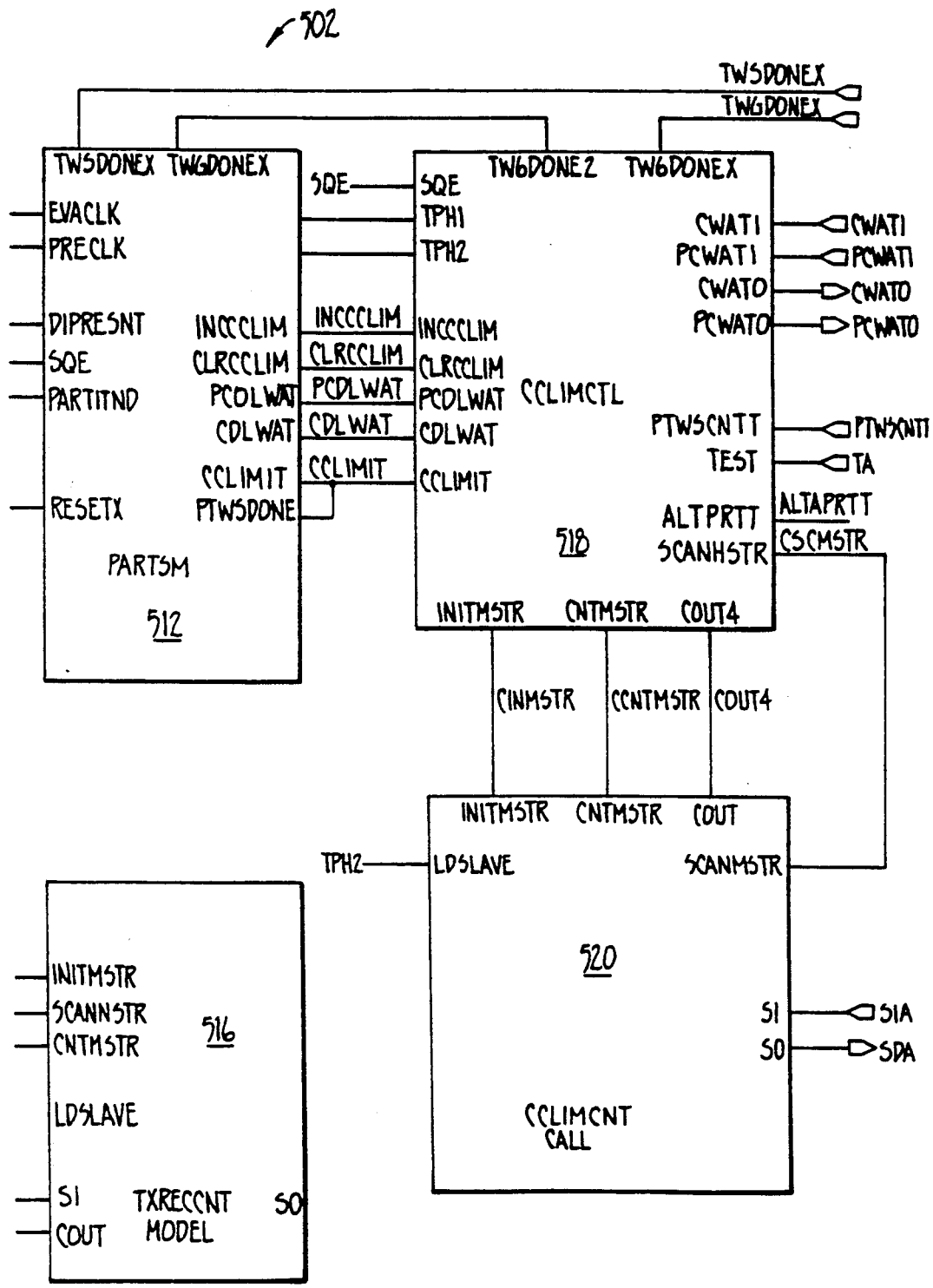

FIG. 10 is a detailed block diagram of the AUISTAT 502 of FIG. 9. The AUISTAT 502 includes an AUI carrier sense detector (AUICSDET) 510, a partition state machine (PARTSM) 512, a transmit recovery control (TXRECCTL) 514, a transmit recovery counter (TXRECCNT) 516, a collision count limit control (CCLIMCTL) 518 and a collision count limit counter (CCLIMCNT) 520. The PARTSM 512 performs equivalently to the IEEE 802.3 Standard partition state machine unless a user selects an alternate reconnection algorithm for the PARTSM 512.

Figures 11, 11A:
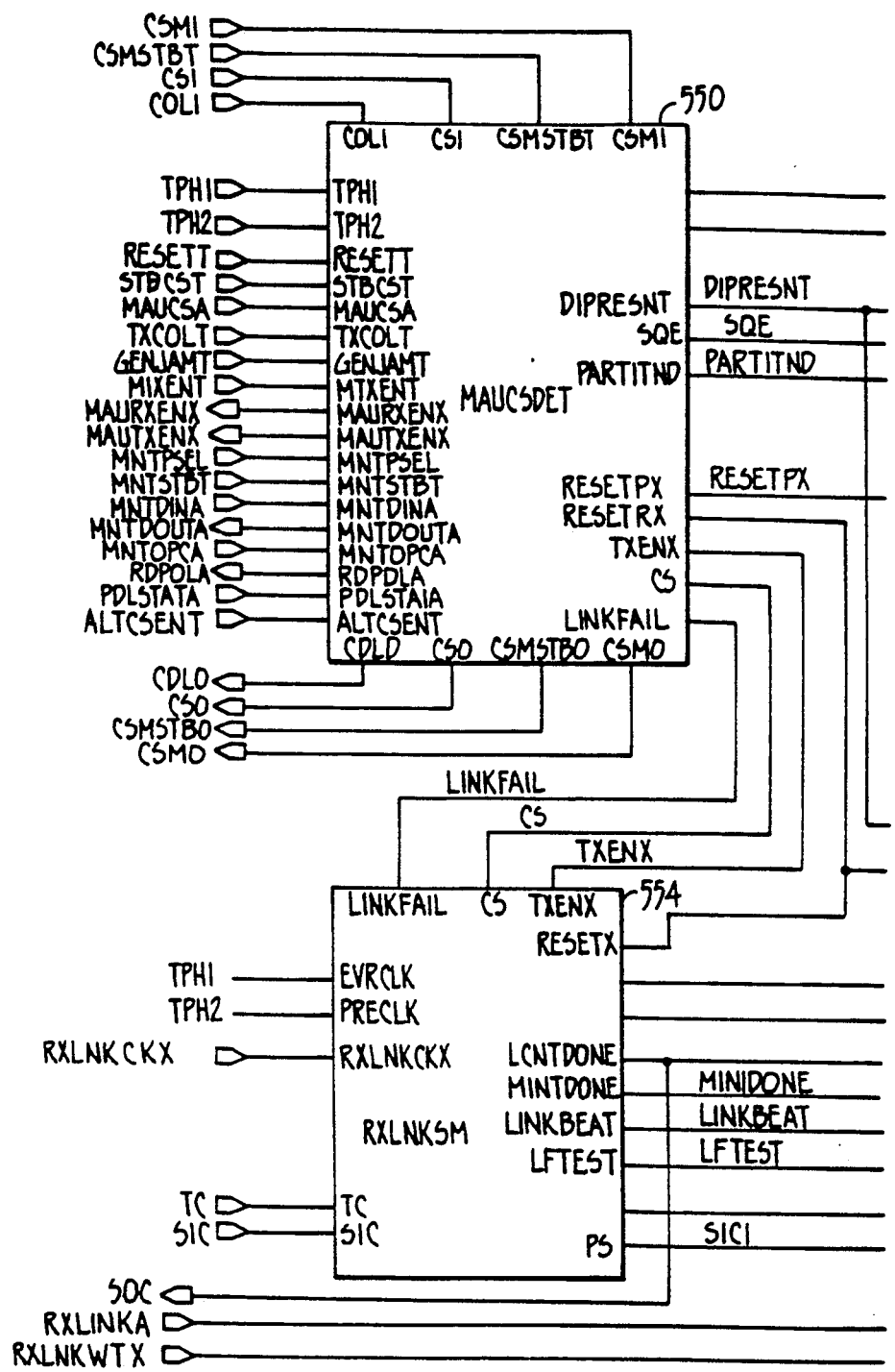
Figure 11B:
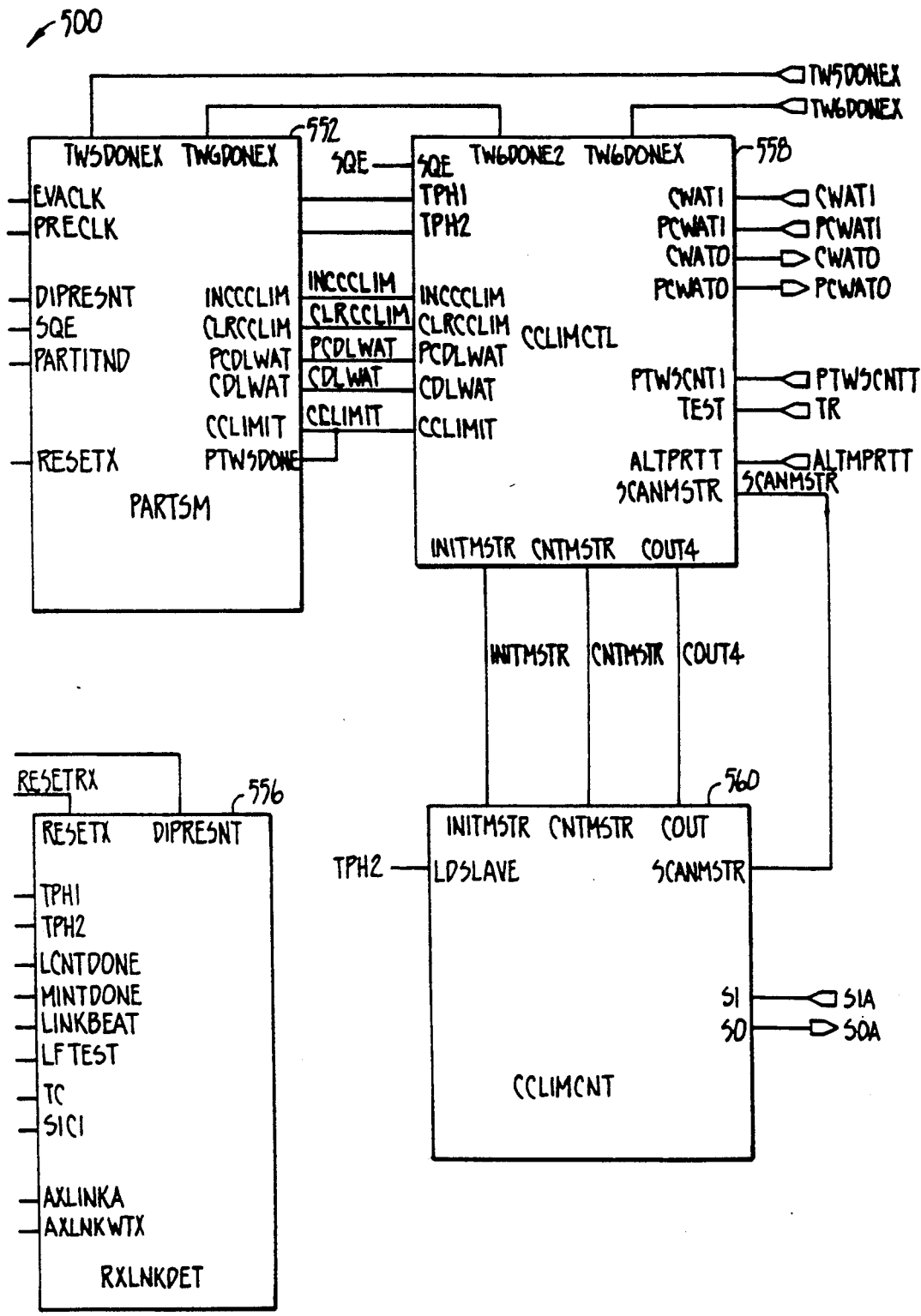

FIG. 11 is a detailed block diagram of the MAUSTAT 500 of FIG. 9. The MAUSTAT 500 includes an MAU carrier sense detector (MAUCSDET) 550, a partition state machine (PARTSM) 552, a receive link state machine (RXLNKSM) 554, a receive link detector (RXLNKDET) 556, a collision count limit control (CCLIMCTL) 558 and a collision count limit counter (CCLIMCNT) 560. The PARTSM 552 performs equivalently to the IEEE 802.3 Standard partition state machine unless a user selects an alternate reconnection algorithm for the PARTSM 552.

Figure 12:
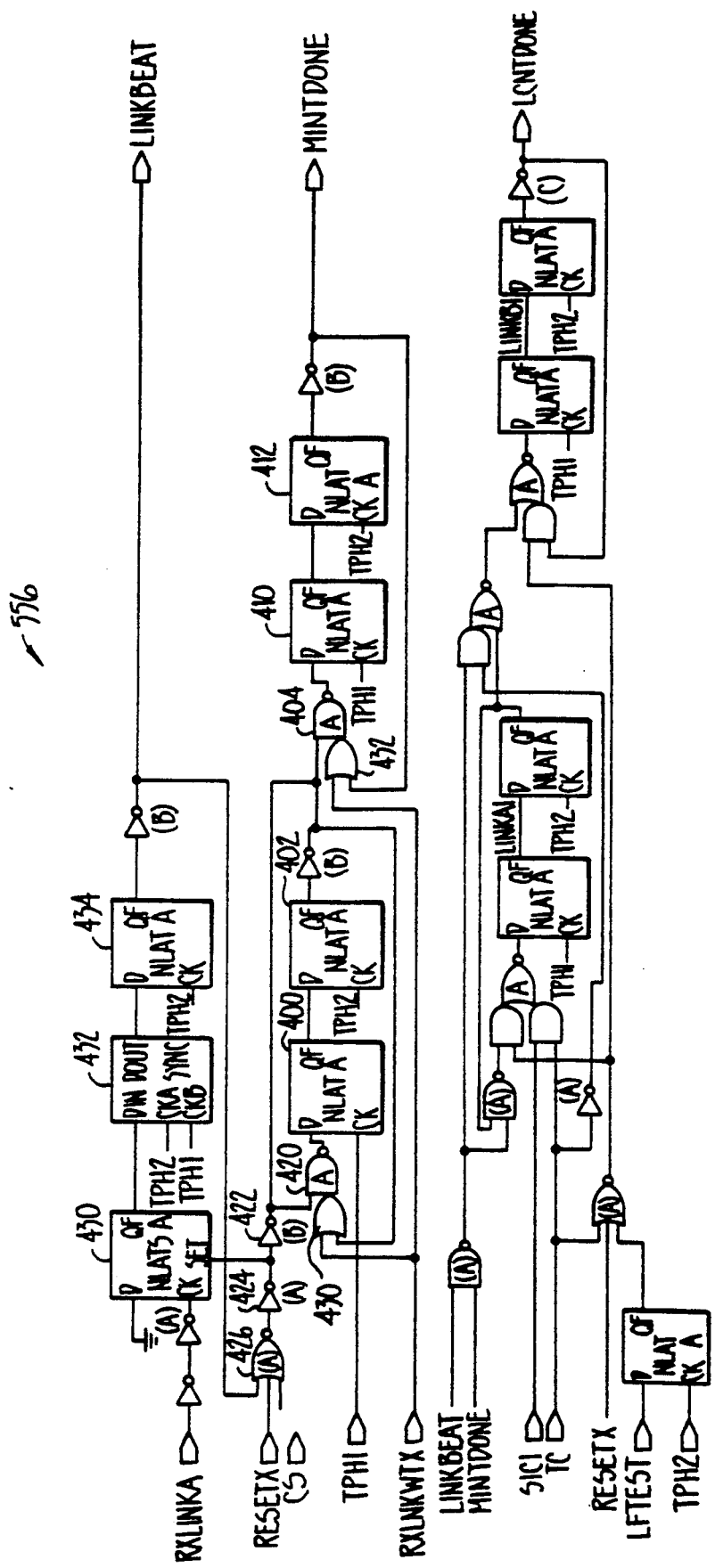

FIG. 12 is a detailed schematic diagram implementing the FIG. 7 circuit for the RXLNKWTX input in the RXLNKDET 556. The signals LINBEAT, RESETX, RXLNKWTX, TPH1 and TPH2 are operative with NLAT 400, NLAT 402 and NAND gate 404 to assert minimum time done (MINTDONE) indicative that a minimum time period elapsed between LINKBEATs. A pair of NLATs, NLAT 410 and NLAT 412 hold a value of MINTDONE to provide a level output rather than a transitory pulse output. A dual input NAND gate 420 receives an input from a series of invertors 422 and 424 having an input coupled to an output of a triple input NOR gate 426. A dual input OR gate 430 produces a logical sum of RXLNKWTX and an inverted output of the NLAT 402. The NAND gate 420 receives the logical sum of the NOR gate 430 at an input. A dual input OR gate 432 produces a logical sum of RXLNKWTX and an inverted output of the NLAT 412. Assertions of a twice inverted receive linkbeat (RXLINKA) signal clocks an NLAT 430 having its data input tied to a particular level which in the preferred embodiment is ground. A synch circuit 432 receives the asserted output of the NLAT 430 and retimes it according to TPH1 and TPH2 and provides the signal to the input of an NLAT 434 having TPH2 as a clock. The NOR gate 426 receives an inverted output of the NLAT 434 (LINKBEAT) at one input. The NOR gate 426 also receives RESETT and a signal indicating that the port received carrier sense (CS). The NLAT 430 includes a set input tied to a once inverted output of the NOR gate 426.

With the input signals RXLINKA, RESETX, CS and RXLNKWTX deasserted, the NLAT 430 does not receive a clock input, resulting in the level of LINKBEAT being undefined until an assertion of RESETX. An assertion of RESETX sets the NLAT 430 which deasserts LINKBEAT. Additionally, the RESETX assertion asserts in turn an output of the NAND gate 420 and the NAND gate 404. The NAND gate 404 assertion deasserts MINTDONE after appropriate timing delays. The NAND gate 420 assertion clears the NLATs 400 and 402 to deassert the inverted output of the NLAT 402 provided to the NAND gate 404 and to the OR gate 430. The configuration of the RESETX, LINKBEAT and CS all equally effectively clear the NLATs 400 and 402 in the manner described above.

The NLATs 400 and 402 are set by an assertion of RXLNKWTX. A subsequent assertion of any of RESETX, CS or LINKBEAT will clear the NLATs 400 and 402. However, two successive RXLNKWTX assertions will deassert the NAND gate 404 output, thereby asserting MINTDONE and latching NLATs 410 and 412 with the new value until cleared.

Figure 13B:
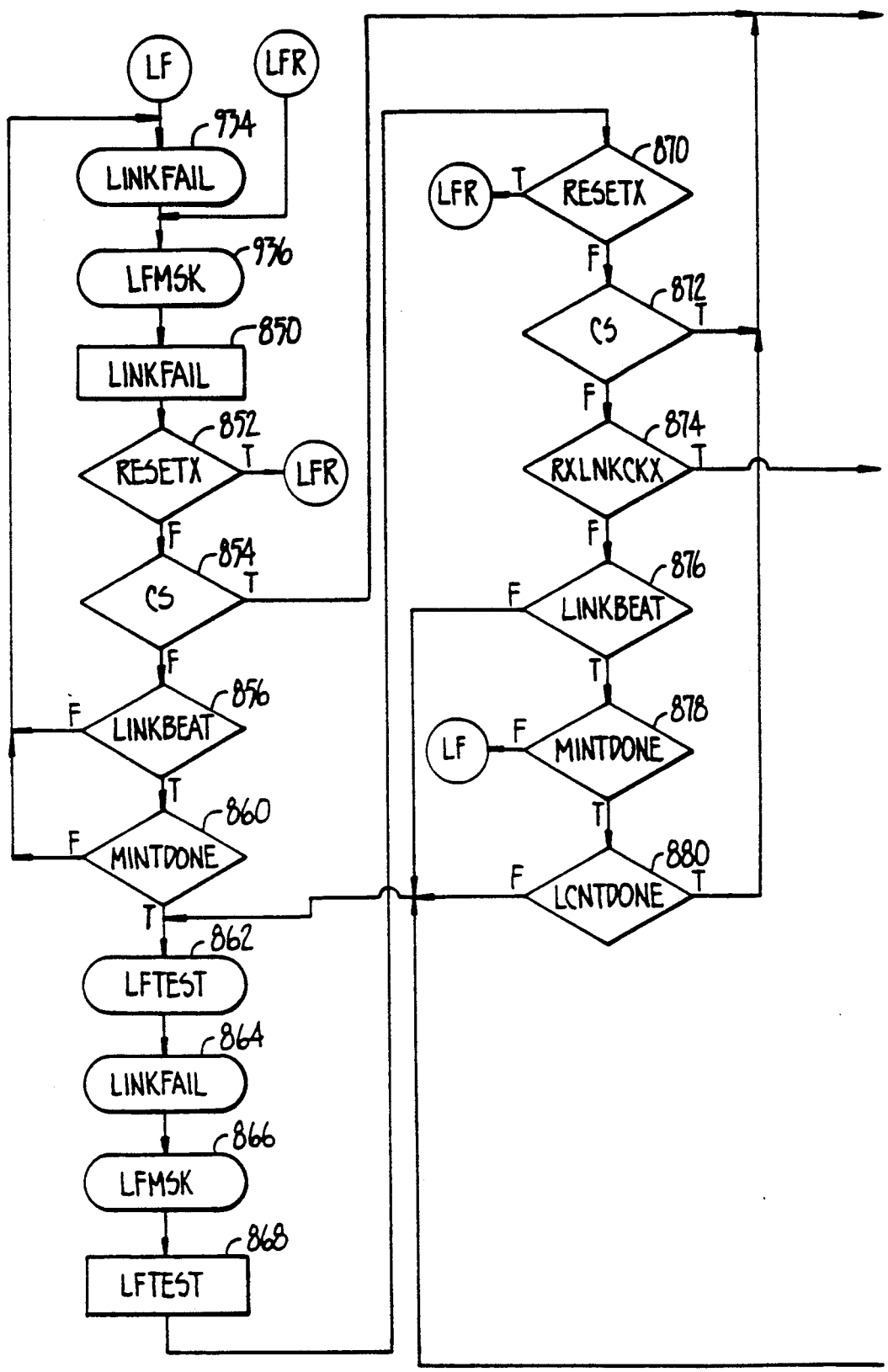
Figure 13C:
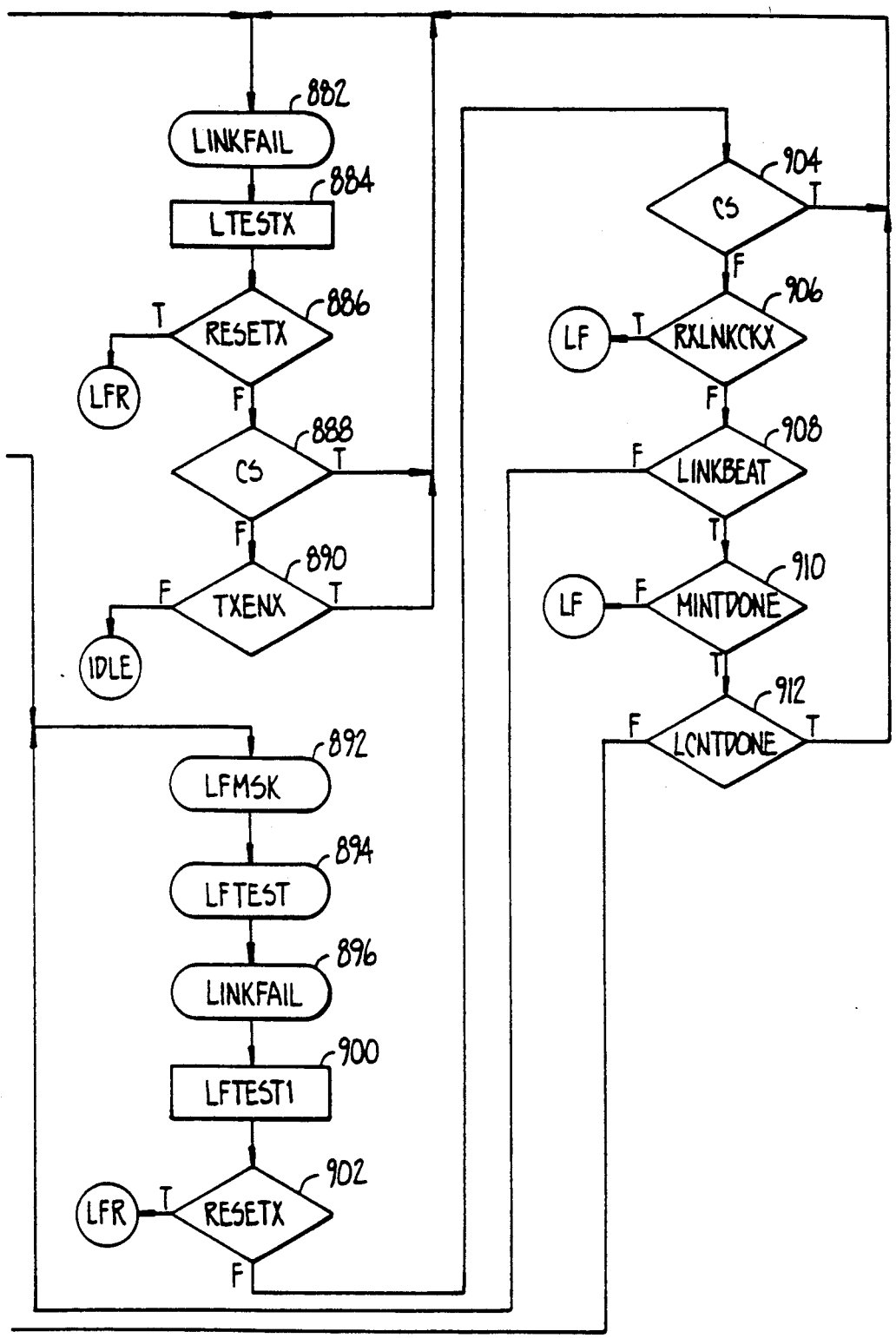

FIG. 13 is a flow chart of the RXLNKSM 554 according to a preferred embodiment of the present invention. The RXLNKSM 554 includes six states and provides a mechanism for determining if too long a period has elapsed (100+/−50 milliseconds) since receipt of a linkbeat or receive activity. The six states include IDLE (step 916), fail check (FAILCK) (step 922), link test fail (LINKFAIL) (step 850), link test fail extended (LTESTX) (step 884), link fail test (LFTEST) (step 868), and linkfail test 1 (LFTEST1) (step 900).

The flow chart of FIG. 13 particularly describes operation of a preferred embodiment of the present invention. Initially, the RXLNKSM 554 enters the LINKFAIL state (step 850) after a hardware reset. The LINKFAIL state, upon asserting a LINKFAIL signal (active low) identifies the port to the IMR 50 as one port that has failed linktest. By putting each RXLNKSM into the LINKFAIL state, each port must prove itself before being enabled. The LINKFAIL state will not, however, assert LINKFAIL as long as RESETX is asserted. This allows for the backward compatibility. The port connected to the node which is not issuing linkbeats is placed in the LINKFAIL state, but as the LINKFAIL signal cannot be asserted, the IMR 50 does not treat the particular port as having failed linktest and the port continues to operate. A port having its LINKFAIL asserted is unable to transmit or receive data. A test at step 854 determines if any receive activity (CS) for the port was detected. If so, the RXLNKSM 554 transitions into the LTESTX state, step 884. Receipt of a linkbeat while in the LINKFAIL state initiates a qualification of the linkbeat to determine if a minimum period exists between the linkbeats, i.e. to check if MINTDONE is asserted. Such testing at steps 856 and 860 determine that the linkbeat is a proper linkbeat. Receipt of a proper linkbeat when in the LINKFAIL state causes the RXLNKSM 554 to transition to the LFTEST, step 868.

The LFTEST state is testing to determine if the port has acquired a link and whether it is therefore able to be reconnected. The IEEE 802.3 Standard defines that receipt of a particular number of linkbeats should cause the RXLNKSM 554 to enable a port to receive or transmit data. A linkbeat counter asserts a signal, LCNTDONE, when it has counted a sufficient number of proper linkbeats. While in the LFTEST state, receipt of an improper linkbeat, too little time between linkbeats, transitions the RXLNKSM 554 back to the LINKFAIL state. Receipt of a proper linkbeat signal causes the RXLNKSM 554 to test whether LCNTDONE is asserted. Assertion of LCNTDONE transitions the RXLNKSM 554 to the LTESTX state. However, too long a period may elapse between receipt of linkbeats, as measured by a timing signal RXLNKCKX. RXLNKCKX is described previously. An assertion of RXLNKCKX while in the LFTEST state, transitions the RXLNKSM 554 to the LKTEST1 state, step 900. LFTEST1 is basically equivalent to the LFTEST state, except that an assertion of RXLNKCKX while in the LFTEST1 state transitions the RXLNKSM 554 to back to the LINKFAIL state, as the maximum time between linkbeats was exceeded. A particular transition after receipt of a proper linkbeat in the LFTEST state depends upon the status of the LCNTDONE signal. An assertion of LCNTDONE transitions the RXLNKSM 554 to the LTESTX state while a deassertion returns the RXLNKSM 554 to the LFTEST state.

When the RXLNKSM 554 is in the LTESTX state, the IMR 50 is waiting for activity, reception or transmissions to stop before the port is reconnected to minimize impact on the network. This is a waiting state just prior to enablement. When CS and TXENX (signal indicating port is transmitting) are both deasserted, the RXLNKSM 554 transitions to the IDLE state, step 916. While in the IDLE state, the RXLNKSM 554 continues to monitor for too great a period of time between receive activity or receipt of linkbeats. An assertion of RXLNKCKX causes the RXLNKSM 554 to transition to a state to check the time interval, namely FAILCK, step 922. A second assertion of RXLNKCKX will send the RXLNKSM 554 into the LINKFAIL state, step 850. Otherwise, a receipt of proper linkbeat will return the RXLNKSM 554 to the IDLE state. An improper linkbeat cycles the RXLNKSM through the FAILCK state, until receipt of a proper linkbeat or an assertion of RXLNKCKX occurs.

III. Linkbeat Reception Disabling

The preferred embodiment of the present invention is able to selectively, on a per port basis, disable linkbeat reception. That is, to maintain compatibility with nodes which do not generate required linkbeats, the selective disablement of a MAU connected to that node will permit the MAU port to maintain transmission and reception relative to the node even though the RXLNKSM 554 otherwise indicates a link fail condition. The IMR 50 receives commands at the TESTPORT 326 through a particular SI signal. For each command, the TESTPORT 326 generates command signals management opcodes (MNTOPCA), a management and test strobe (MNTSTBT), and management addresses (MNTADRA). The MNTOPCA includes three bit lines; MNTOPCA(0), MNTOPCA(1) and MNTOPCA(2). The MNTADRA includes four bit lines; MNTADRA(0), MNTADRA(1), MNTADRA(2) and MNTADRA(3). The STATCTL 504 of the STATUS 304 receives the MNTADRA bits and decodes the address to assert a management port select (MNTPSEL) signal to the appropriate port. Appropriate MNTPSEL, MNTOPCA, MNTSTBT and RESETT, set a latch in a particular MAUSTAT 500 to indicate a disabling of linkbeat reception. In the preferred embodiment, for example, RESETT initiates the latch indicating an enablement of linkbeat reception. Appropriate MNTPSEL, MNTOPCA, MNTSTBT and RESETT will also selectively reenable linkbeat reception for a particular port. An output of the latch drives RESETX of the RXLNKSM 554. The RESETX puts the particular RXLNKSM 554 into a linkfail condition but with a link pass indication as an output. Thus, the IMR 50 operates as if the LINKTEST was successful due to the pass indication but upon reenablement, the RXLNKSM 554 must pass LINKTEST before successful operation.

Figure 14:
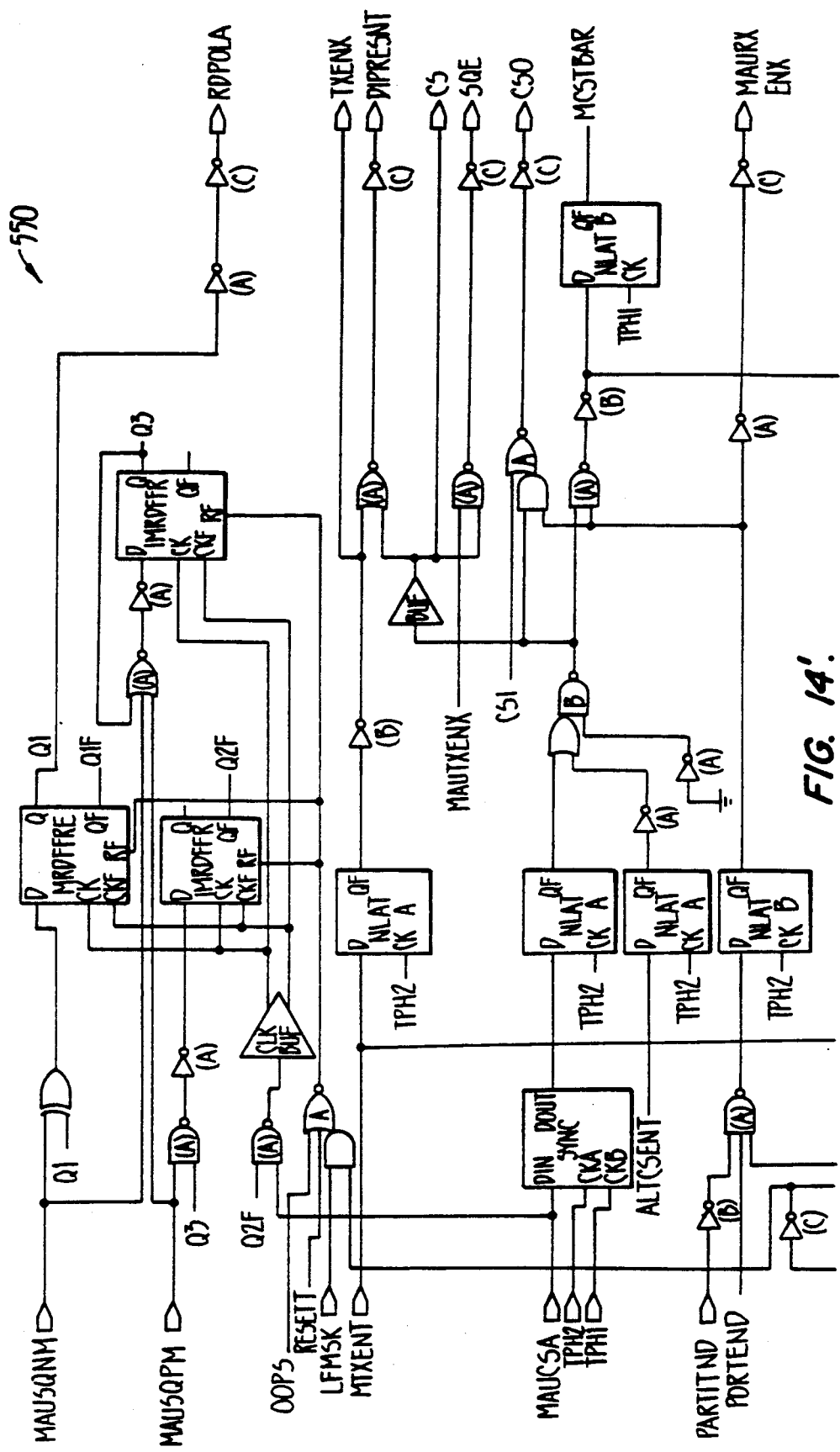
Figure 14:
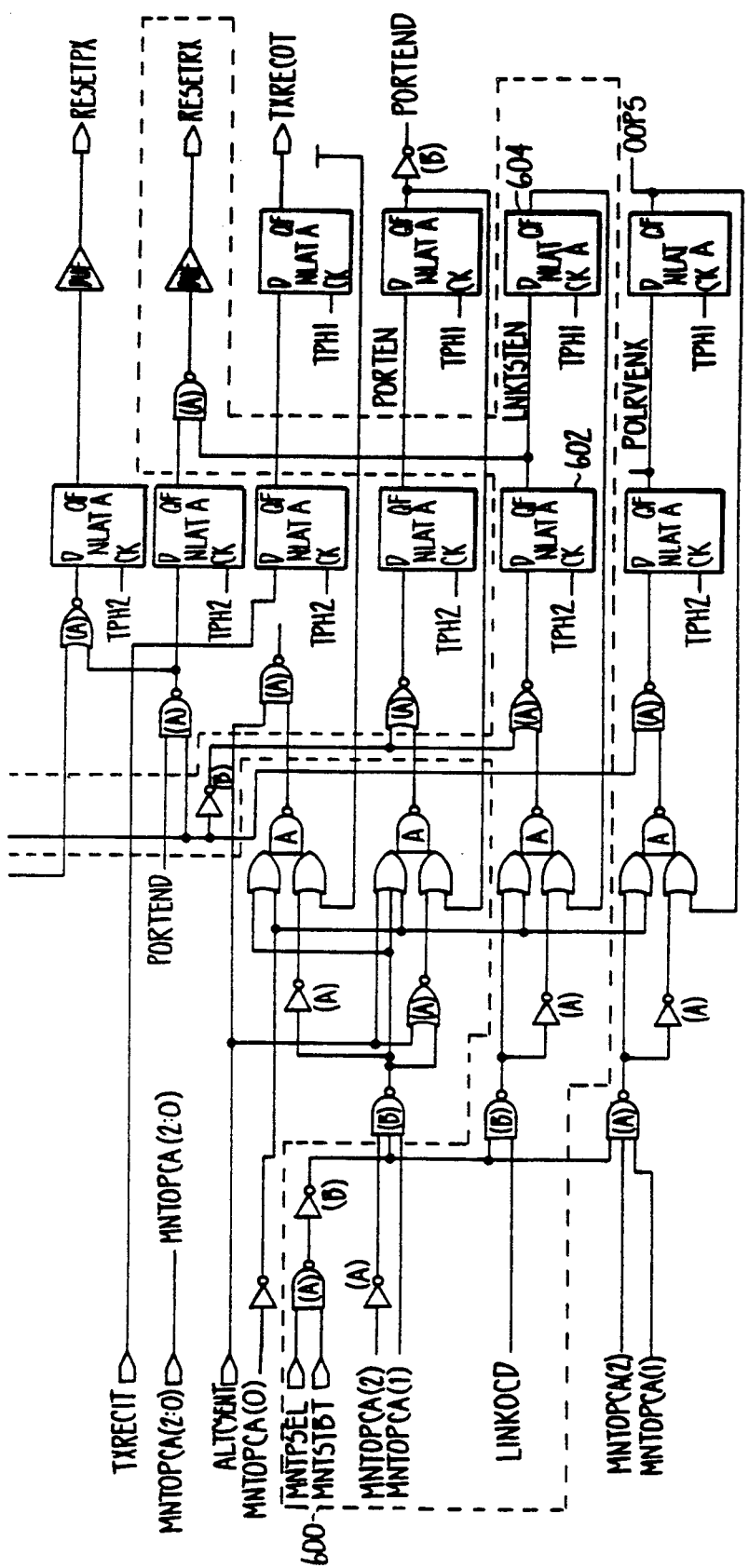
Figure 14:
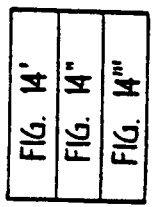

FIG. 14 is a detailed schematic diagram of the MAUCSDET 550 of FIG. 11. FIG. 14 includes a circuit for linkbeat reception disabling identified as circuit 600. The circuit 600 takes the MNTOPCA(1), MNTOPCA(2), MNTPSEL, MNTSTBT and RESETT to control a linktest enable signal (LNKTSTEN). Assertion or deassertion of LNKTSTEN influences the condition of a receive reset signal (RESETRX). Specifically, setting a latch composed of a pair of NLATs 602 and 604, for example, determines whether the RXLNKSM 554 is able to look for linkbeat. Deassertion of LNKTSTEN disables linkbeat reception because RESETRX becomes asserted. As seen in FIG. 11, RESETRX becomes RESETX in the RXLNKSM 554 and in the RXLNKDET 556.

Figure 14A:
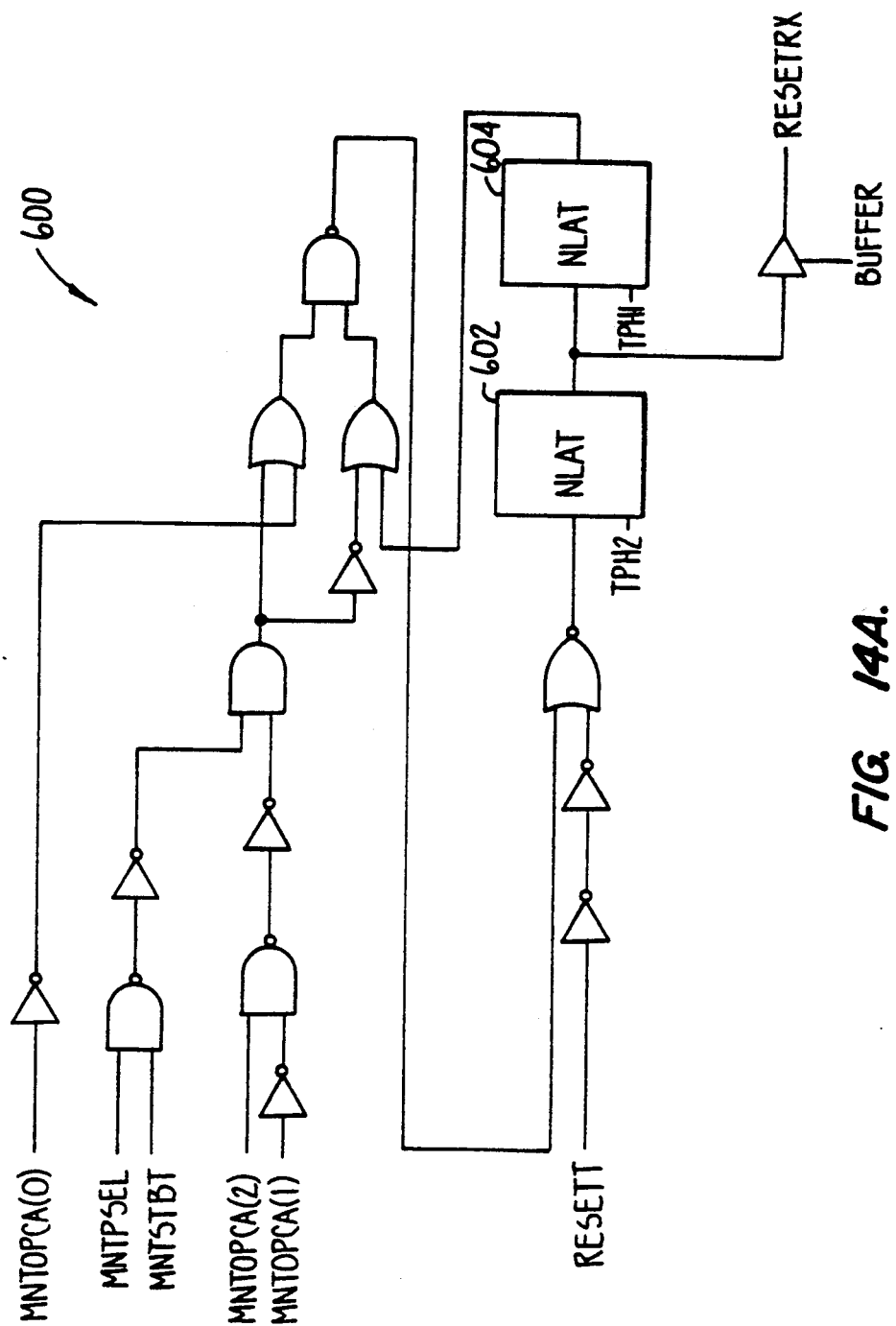
FIG. 14A is a detailed schematic of the circuit 600 of FIG. 14.

FIG. 14A is a detailed schematic of the circuit 600 of FIG. 14. Particular combinations of MNTOPCA sets or clears the latch made up of the NLAT 602 and the NLAT 604 allowing linkbeat reception to be selectively enabled or disabled on a per port basis. The STATCTL 504 selectively asserts MNTPSEL to a particular port corresponding to a particular MNTADRA allowing the selective control of a particular port.

IV. Serial Port Activity Scan

The serial port activity scan function provides carrier sense information about each port to an output pin (CRS) of the IMR 50 in serial format. This format allows access to this carrier sense information for hub management purposes with a reduced set of pins. In the preferred embodiment having eight twisted pair ports and one AUI port, the CRS data output includes 10 bit positions. Nine of these positions correspond to the ports, one position per port. The tenth position does not correspond to a port and simply reserves a bit time for issuance of a strobe pulse (STR). The IMR 50 generates the strobe pulse (STR) upon every tenth bit position of the CRS stream which delineates a set of carrier sense signals for the ports. Each position of the CRS bit stream, other than the position corresponding to the STR position, indicates whether or not carrier sense for a particular port was active at any time during the last sample period.

Figure 20:
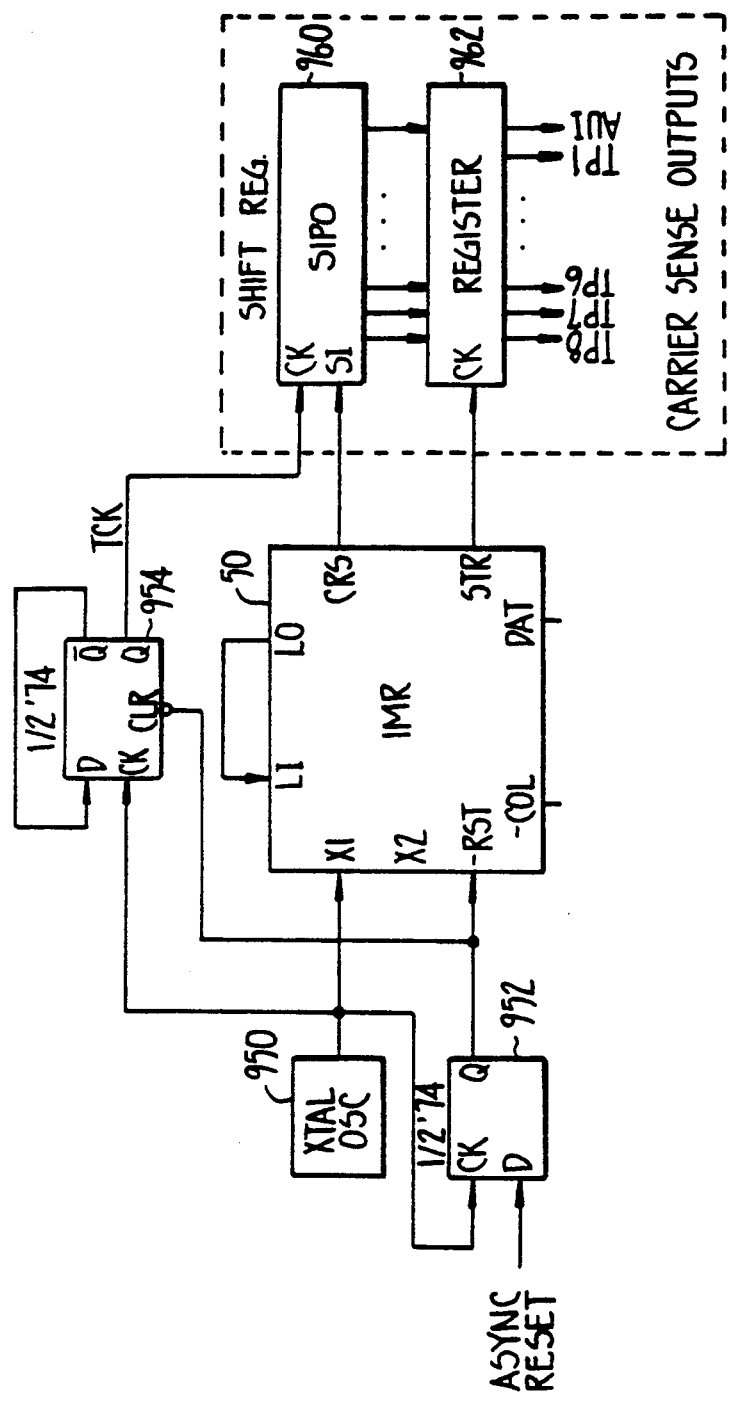
FIG. 20 is an implementation of the preferred embodiment of the present invention including a carrier sense monitor function.

FIG. 20 is an implementation of the preferred embodiment of the present invention including a carrier sense monitor function. To particularly identify each bit position, a clock synchronized to the IMR 50 internal 10 megahertz clock will permit a serial-to-parallel transformation of a set of carrier sense signals. The IMR 50 receives an external clock signal for an external clock 950 which in the preferred embodiment is 20 megahertz, for example. A first D flip/flop 952 synchronizes the clock output to an asynchronous reset. This synchronized reset is applied to the IMR 50 and to a second D flip/flop 954 that receives the external clock. In this fashion, a Q output of the flip/flop 954 is a 10 megahertz clock which matches the internal clock of the IMR 50. The flip/flop 954 clock can sample each bit position in the serial bit stream out (CRS) by clocking a shift register 960 with its output. The assertion of STR loads the shift register 960 into a register 962 completing the serial-to-parallel transformation.

The preferred embodiment of the present invention provides a latch associated with each port which is set upon any carrier sense activity. Daisy chaining all the latches of the ports together permits each latches value to be accessed and added to a serial bit stream. A token cycles through the ports and causes each particular port's latch to contribute its value to a serial data stream to ultimately be output as CRS. A port which does not have the token simply passes data from a previous port to a later port. After the latch adds its stored value to the bit stream in response to the token, the token causes a reset of the latch unless the port continues to detect carrier sense. Otherwise, the latch remains unchanged until the next sampling period when the token cycles through.

Specifically, a circuit 650 included in the MAUCSDET 550 illustrated in FIG. 14 is a generic circuit for receiving a token (assertion of carrier sense master strobe in "CSMSTBI") to query a latch made up of an NLAT 652 and an NLAT 654. Assertion of carrier sense (CS) for the particular port sets the latch combination of the NLAT 652 and the NLAT 654. Assertion of CSMSTBI causes the logic gate combination 656 to output the status of the NLATs 652 and 654 as a carrier sense management output (CSMO). Deassertion of the CSMSTBI causes the logic gate combination 656 to output carrier sense management input (CSMI) directly to CSMO, where CSMI is CSMO of an immediately preceding port. An assertion of CSMSTBI propagates through an NLAT 660 and an NLAT 662 to assert carrier sense master strobe out (CSMSTBO) one clock cycle (assertion of successive TPH1 and TPH2 pulses, in either order) after assertion of CSMSTBI. The output of CSMO however is not propagated by a latch, providing for the daisy chain connection to propagate each port's latch status. As can be seen in FIG. 9, CSMO of a particular port becomes CSMI of an immediately subsequent port. The same is true for the CSMSTBO of a port, it becomes CSMSTBI of the immediately subsequent port. This token system works in this fashion for all the ports.

Figure 15:
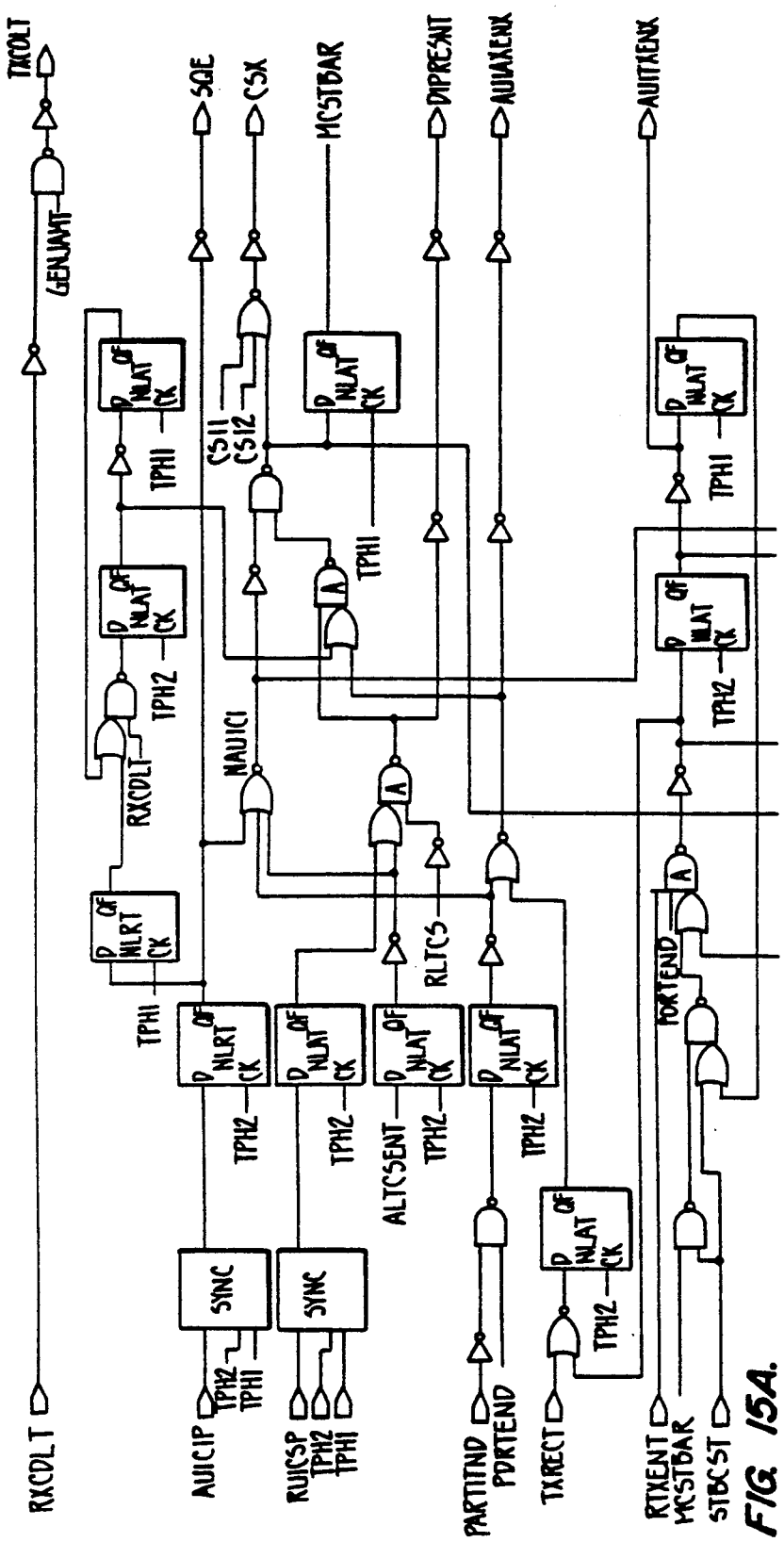
Figure 15B:
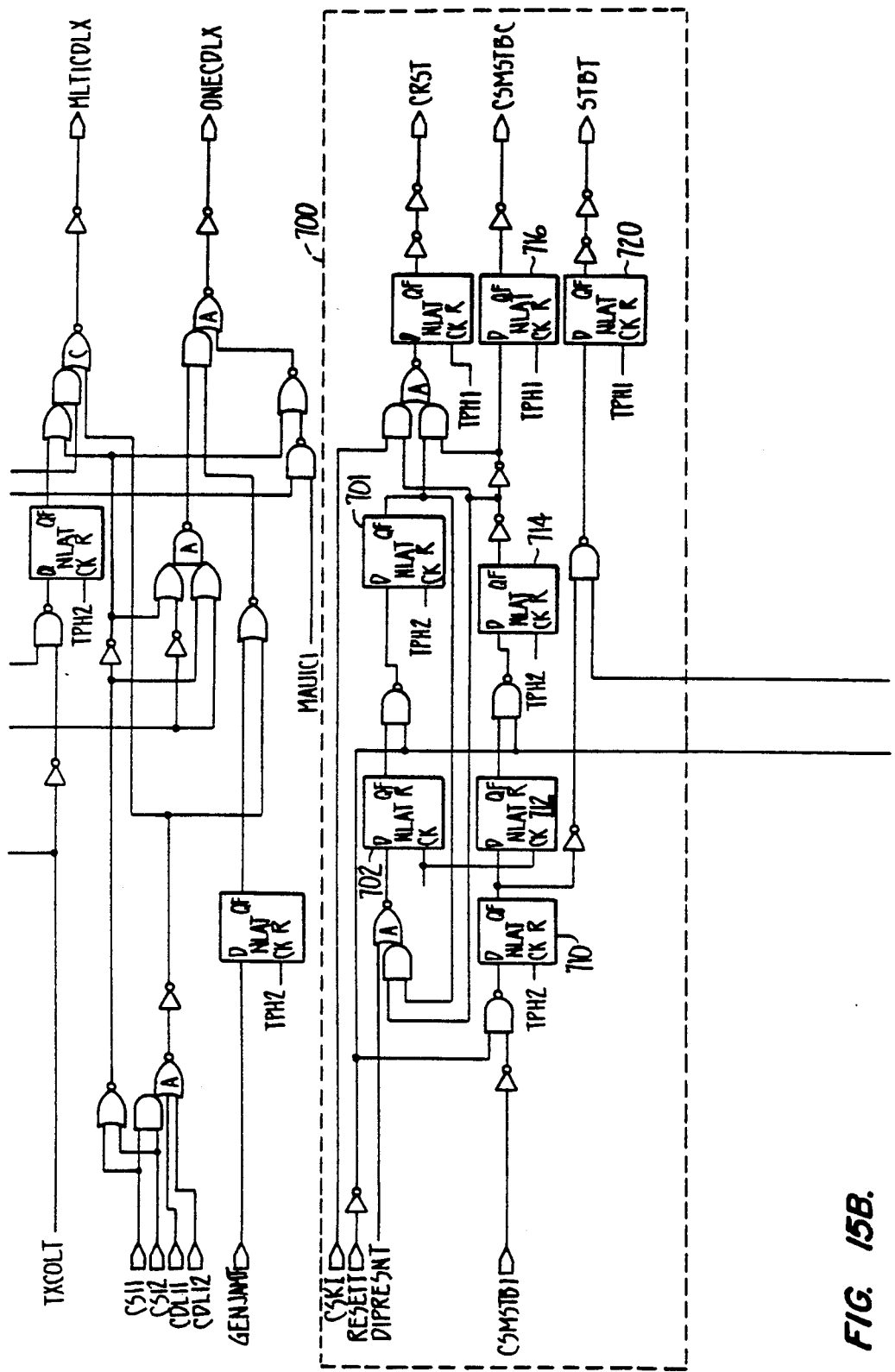
Figure 15C:
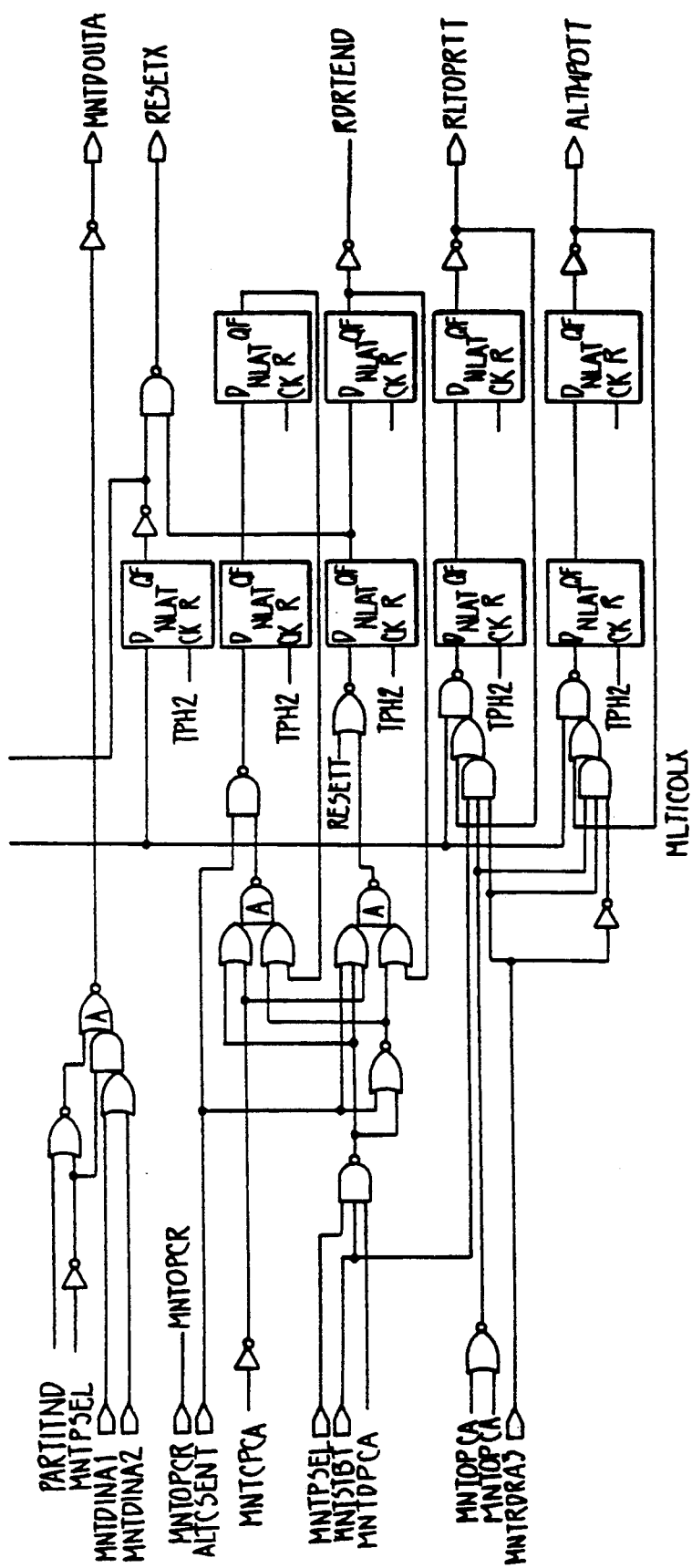

FIG. 15 is a circuit diagram of the AUICSDET 510 of FIG. 10. The AUICSDET 510 initiates the token upon reset, adds the tenth space pulse to the carrier sense serial bit stream that has propagated through the ports, and channels the final bit stream and its associated strobe to the TESTPORT 326 as CRST (to be PADCRS) and STBT (to be PADSTB), respectively.

The AUICSDET 510 includes a circuit 700 for initiating a first token to a first port after reset. This first token is CSMTBO and inputs to the first port in line. The circuit 700 circuit includes all the functions of the circuit 650 of the MAUCSDET 550 and includes the token initiation feature, pulse addition, and extracts a strobe which has passed through all the ports as the strobe for the TESTPORT 326. As seen in FIG. 9, the CSMSTBO of the AUISTAT 502 becomes the initial strobe (STBE) provided to a first MAUSTAT 500 as CSMSTBI.

An NLAT 702 and an NLAT 704 store the equivalent of carrier sense for an AUI port, that is DI. These NLATs 702 and 704 correspond to the NLATs 652 and 654 of the circuit 650 of FIG. 14. AUICSDET 510 passes the bit stream received from the CSMI input onto the CRST signal, until the token from the last MAUSTAT 500. Assertion of CSMSTBI contributes the value stored in the NLATs 702 and 704 to CRST. After one clock, the token passes through a pair of NLATs, NLAT 710 and NLAT 712. A second pair of NLATs, an NLAT 714 and an NLAT 716 reinitiates the token to the ports by asserting CSMSTBO to the first MAUSTAT 500. An NLAT 720 samples the strobe propagating through the NLATs 710 and 712 to provide the STBT signal which indicates that the token sampled all the ports and that the output of the CRS pin is a complete set.

Figure 16:
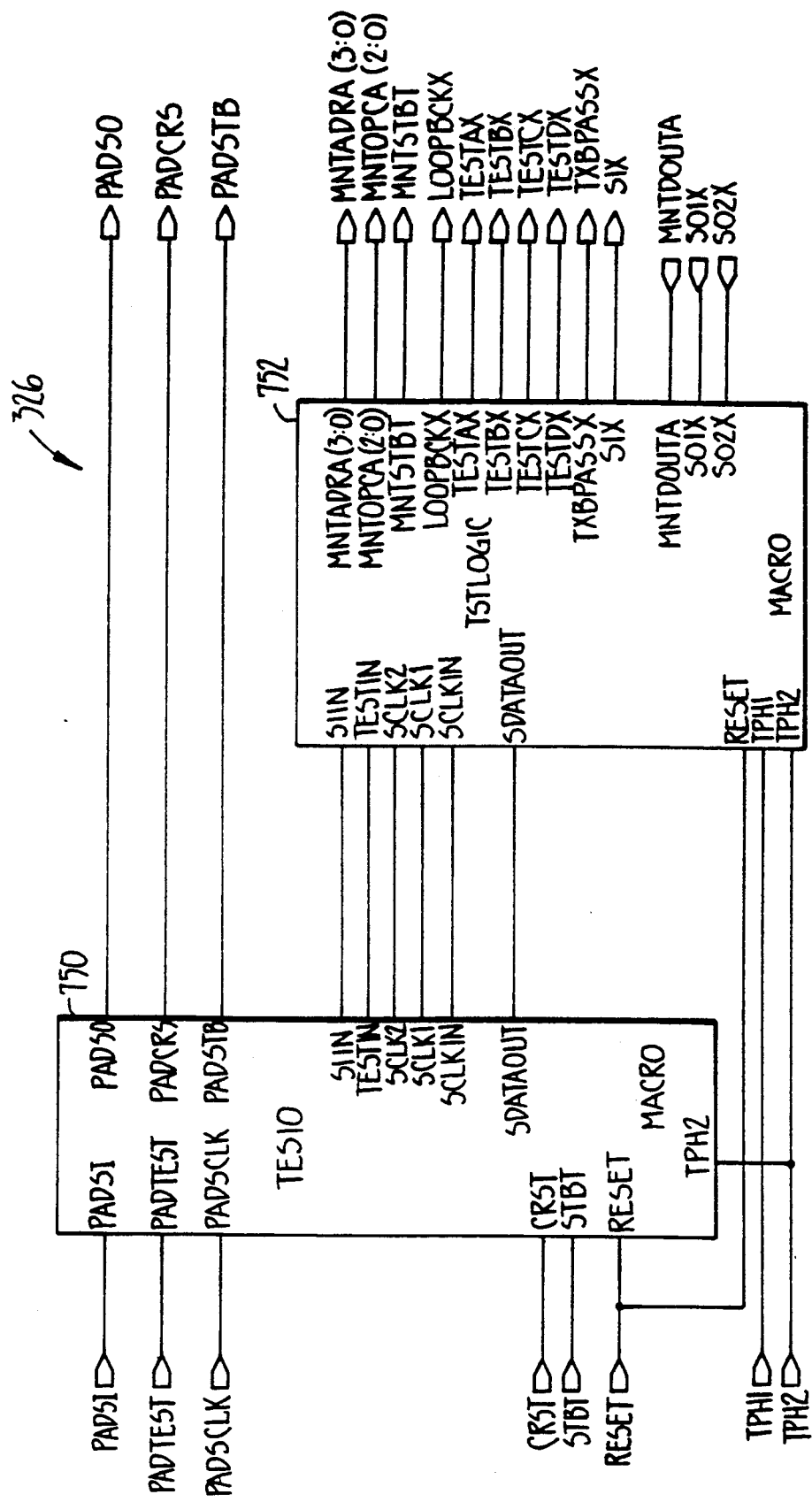

FIG. 16 is a block diagram of the TESTPORT 326 including a testport I/O (TESTIO) 750 and a test logic 752. The TESTIO 750 receives the signals CRST and STBT from the AUICSDET 510 of the STATUS 304 and transforms them into signals to be driven onto output pins.

Figure 17:
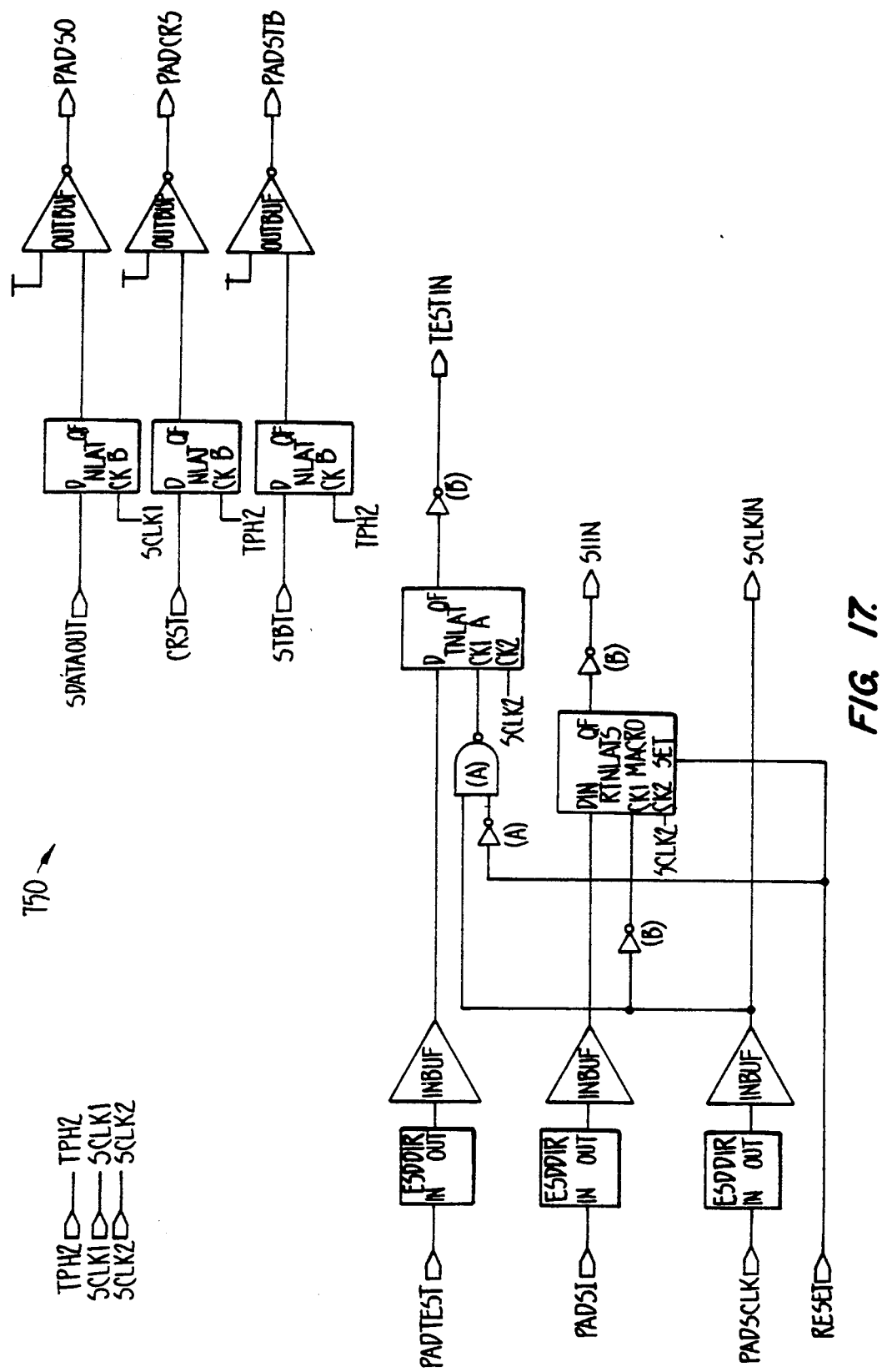

FIG. 17 is a schematic diagram of the TESTIO 750 illustrating the transformation of the CRST and STBT signals to the PADCRS and PADSTB signals respectively.

V. Phase-locked Loop

The preferred embodiment of the present invention uses a single phase-locked loop to decode and extract clock and data information. A phase-locked loop has traditionally been associated with each port when the MAU and the repeater were discrete items. Integration of the MAU and repeater functions permits the IMR 50 to share a phase-locked loop among all its ports. This is possible as only one port can validly receive a packet for decoding at any particular time. Thus, all data inputs from the different ports may be multiplexed together and input to the single phase-locked loop. If multiple ports require the use of the phase-locked loop at one time, a collision condition is eminent. Thus, by monitoring all the carrier sense signals and disabling the phase-locked loop upon assertion of more than a single carrier sense signal, the IMR 50 may effectively share the single phase-locked loop.

Figures 18, 18C:
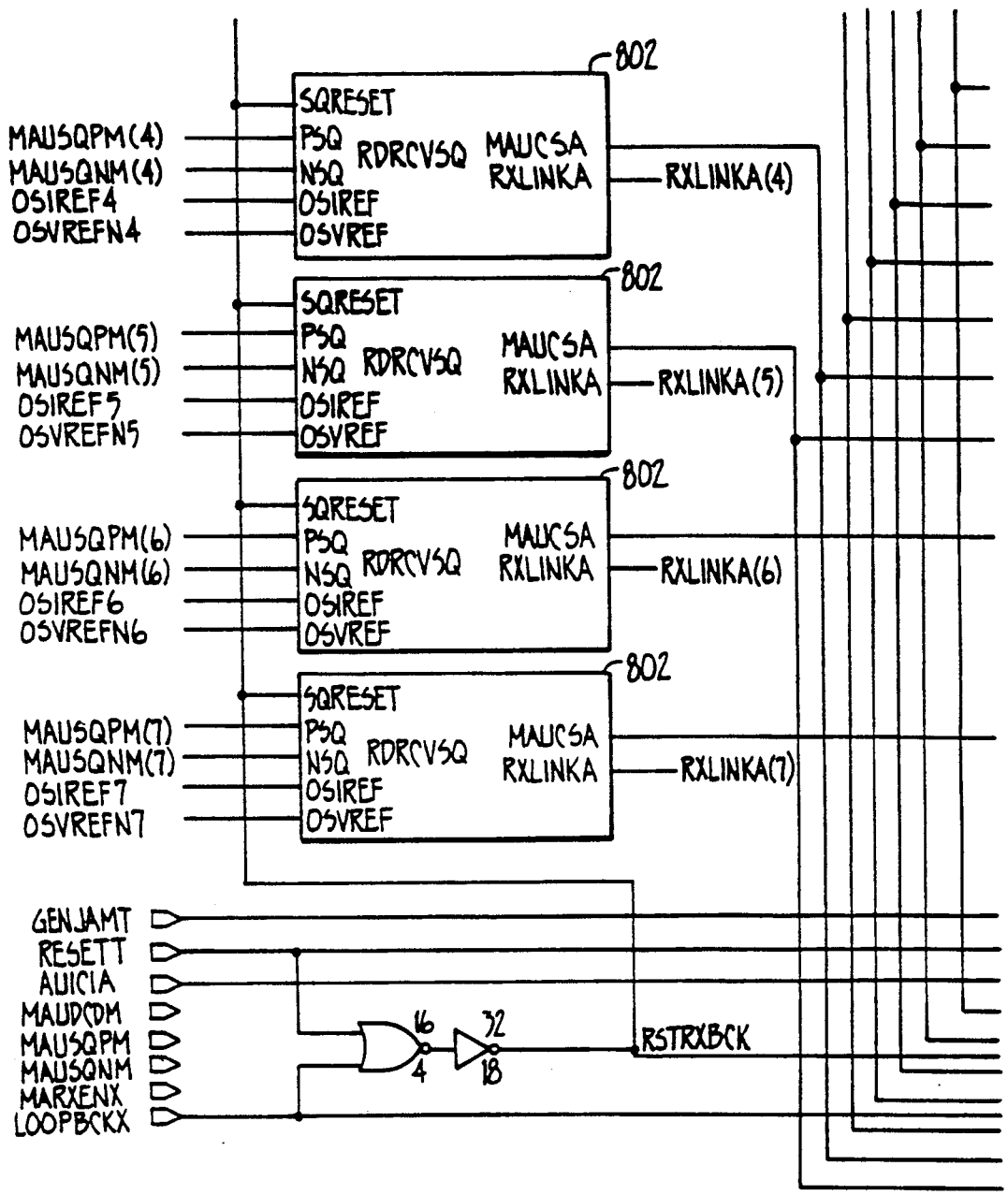
Figure 18A:
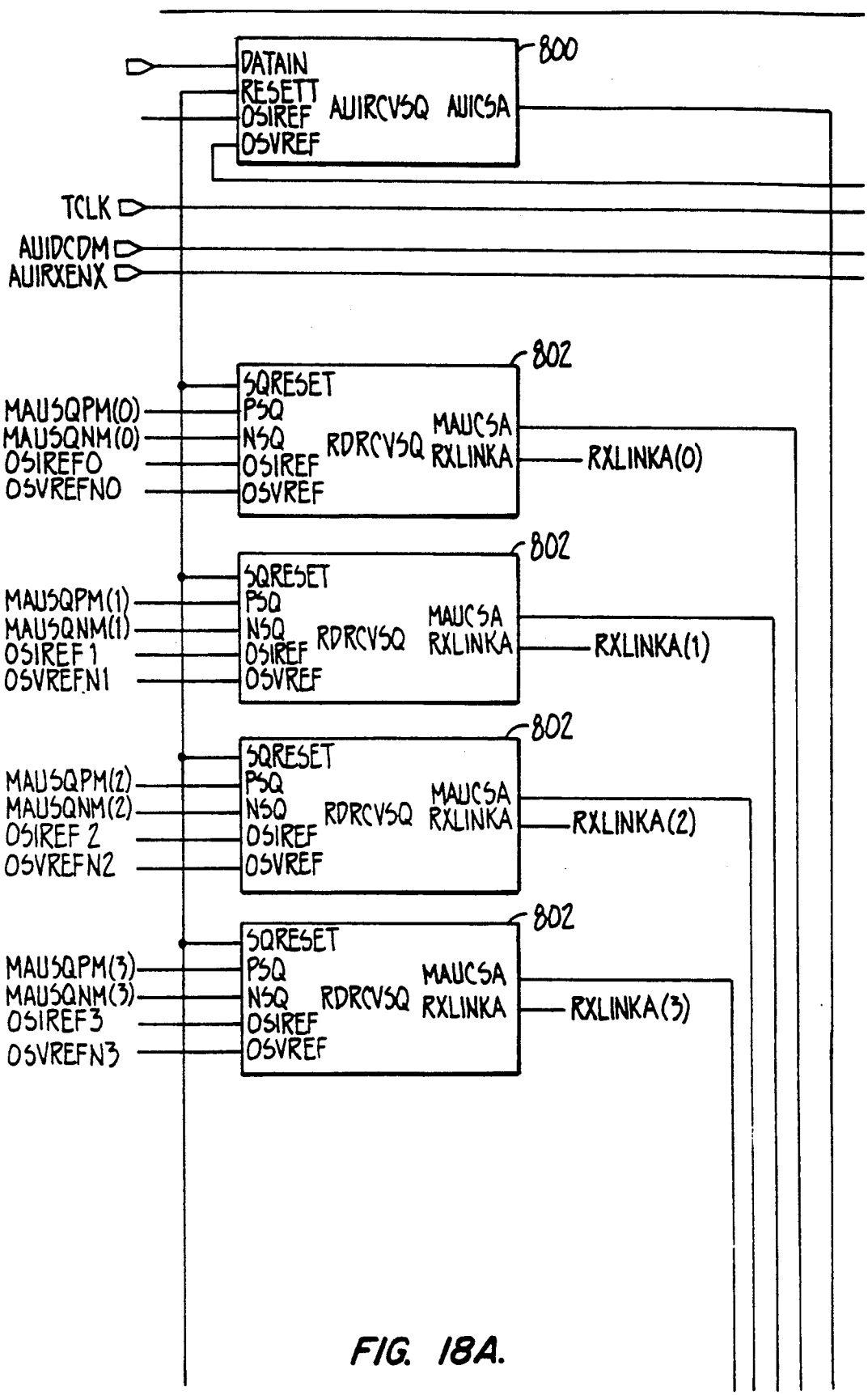
Figure 18B:
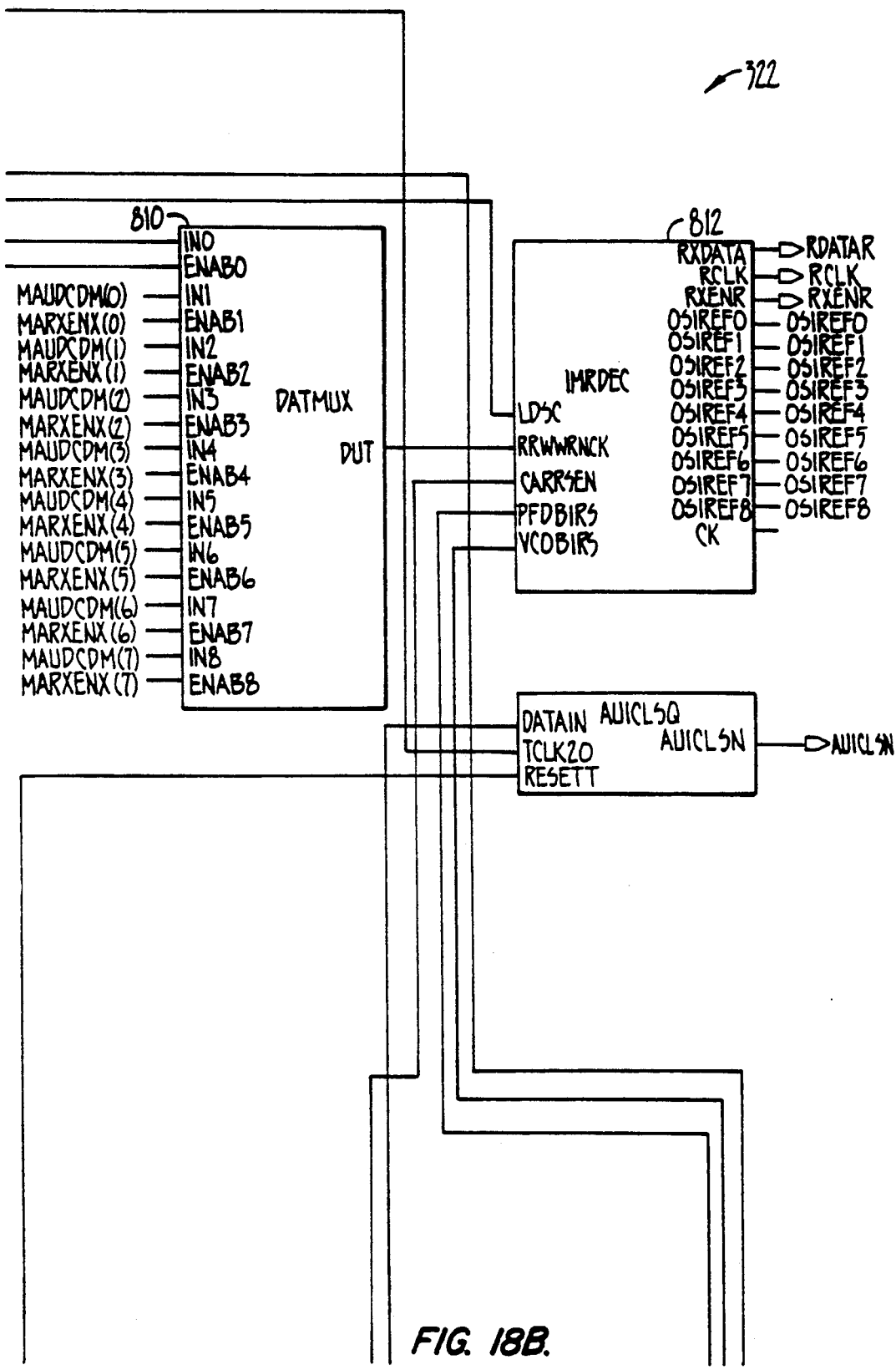
Figure 18D:
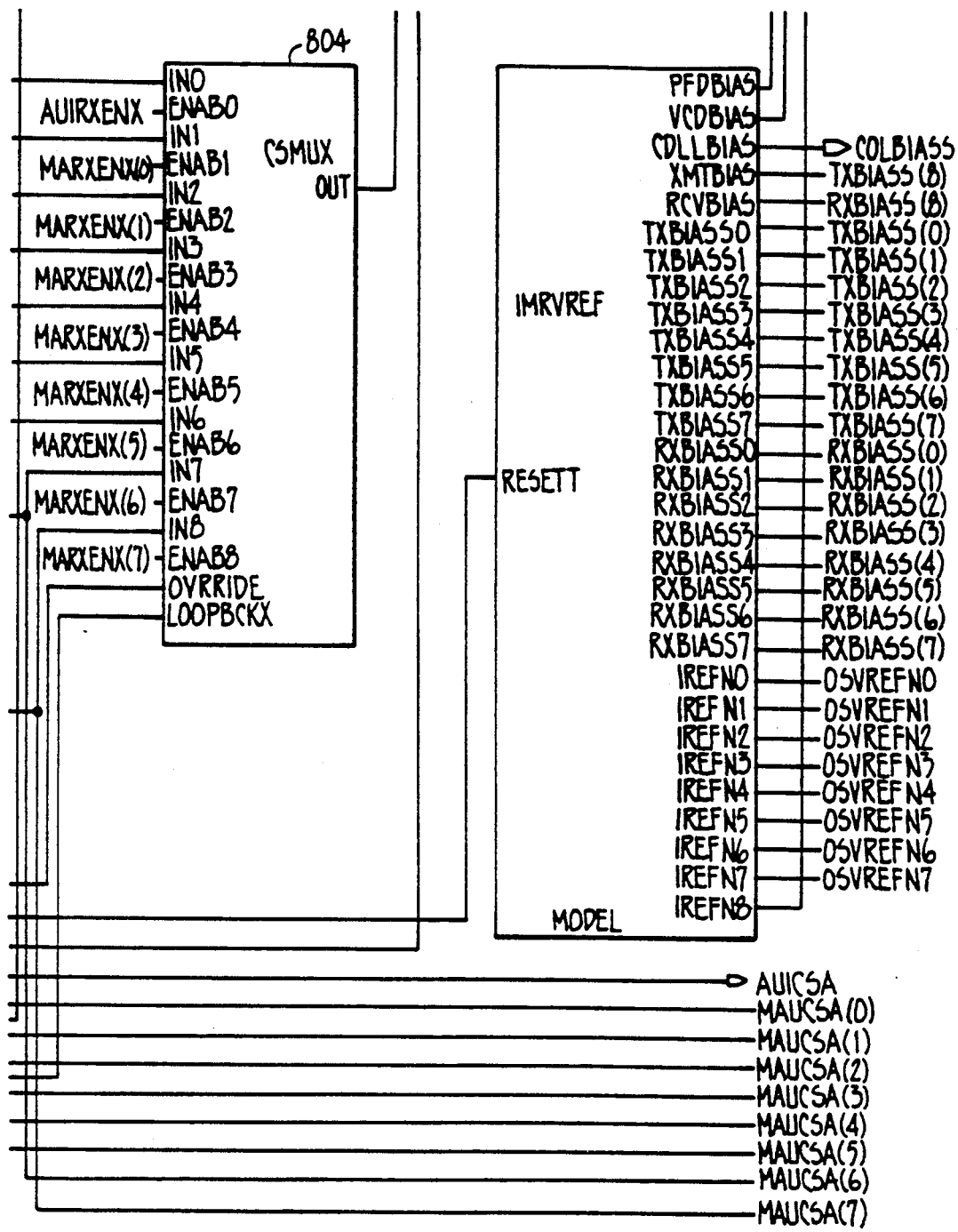

FIG. 18 is a block diagram of the RXBCKEND 322 in the IMR 50. Squelch receivers for the AUI (AUIRCVSQ 800) and for each twisted pair port's receive data (RDRCVSQ 802), provide carrier sense signals to a carrier sense multiplexer (CSMUX) 804. The CSMUX 804 is responsive to a signal commanding the IMR 50 to generate a jam sequence due to a detected collision, namely GENJAMT. The STATUS 304 also receives carrier sense information and sends that information to the IMRSM 300, causing it to assert GENJAMT upon detecting multiple carrier sense activity. The IMR 50 includes a loopback test option, which when activated, asserts LOOPBCKX. A data multiplexer (DATMUX) 810 receives data input from each of the ports and outputs a particular selected port's data to an IMR decoder (IMRDEC) 812 which incorporates the phased locked loop. The CSMUX 804 and the DATMUX 810 essentially produce a logical product of all the carrier sense signals on the one hand, and all the input data on the other hand. For the CSMUX 804, any qualified carrier sense input asserts an output signal (OUT) to the IMRDEC 812. IMRDEC 812, in response to the CSMUX 804 asserting OUT, attempts to lock on to and to decode an output signal OUT from the DATMUX 810. Generally, phase-locked loops are well known in the art. For a further description of a phase-locked loop adaptable for use with the described embodiment of the present application, please refer to U.S. patent application Ser. No. 07/595,068 entitled, "Bi-Phase Decoder Phase-locked Loop (PLL) in CMOS" filed Oct. 10, 1990, now abandoned which is incorporated by reference for all purposes. The PLL operates by locking on to a reference signal having a nominal frequency approximate to that of input packet signal. Upon detecting an input packet, the PLL locks onto the input packet. Clock signals generated by the PLL thereby extract an embedded clock from the input packet which in turn extracts the data from the input packet.

When more than one port receives an input packet, the CSMUX 804 continues to assert its OUT signal to the IMRDEC 812, causing the IMRDEC to attempt to decode the information from DATMUX 810 OUT. With two or more overlapping data inputs, the single PLL is unable to reliably lock onto any particular signal and therefore the PLL is unable to extract any data. Since overlapping signals from the DATMUX 810 output is indicative of a collision condition, the PLL does not have to decode any data. After particular time delays, the IMRSM 300 will assert GENJAMT which becomes an override (OVRRIDE) signal input to the CSMUX 804. Assertion of OVRRIDE will deassert the OUT signal (which becomes carrier sense enable (CARRSEN)) from the CSMUX 804 to the IMRDEC 812 irrespective of any carrier sense signal. With CARRSEN deasserted, the IMRDEC 812 locks onto its reference signal until assertion of CARRSEN once again. Assertion of GENJAMT initiates jam sequence generation to all nodes causing them to quit transmitting to the IMR 50, and thereby deasserts all the carrier sense signals, followed by a subsequent assertion of one or more carrier sense signals will reassert CARRSEN.

Previously in the description of the CSMUX 804 and the DATMUX 810, the description used the term qualified signal. Qualification of each carrier sense into the CSMUX 804, or of the data input into DATMUX 810 results from a logical product of the signal and a port specific enable signal. Each MAUCSDET 550 of the STATUS 304 will assert a port specific MAURXENX signal indicating whether the port is able to receive data, for example, whether the PARTSM 552 partitioned the port. A partitioning of a particular port results in deassertion of MARXEN(x) (MAURXENX for port x). The CSMUX 804 and the DATMUX 810 each qualify a particular input signal by producing a logical product of the particular input signal and that signal's associated MARXENx signal. With MARXEN3 deasserted for example, CS for port 3 will not be able to assert CARRSEN to the IMRDEC 812, nor will port 3's data appear at OUT of the DATMUX 810.

Figure 19:
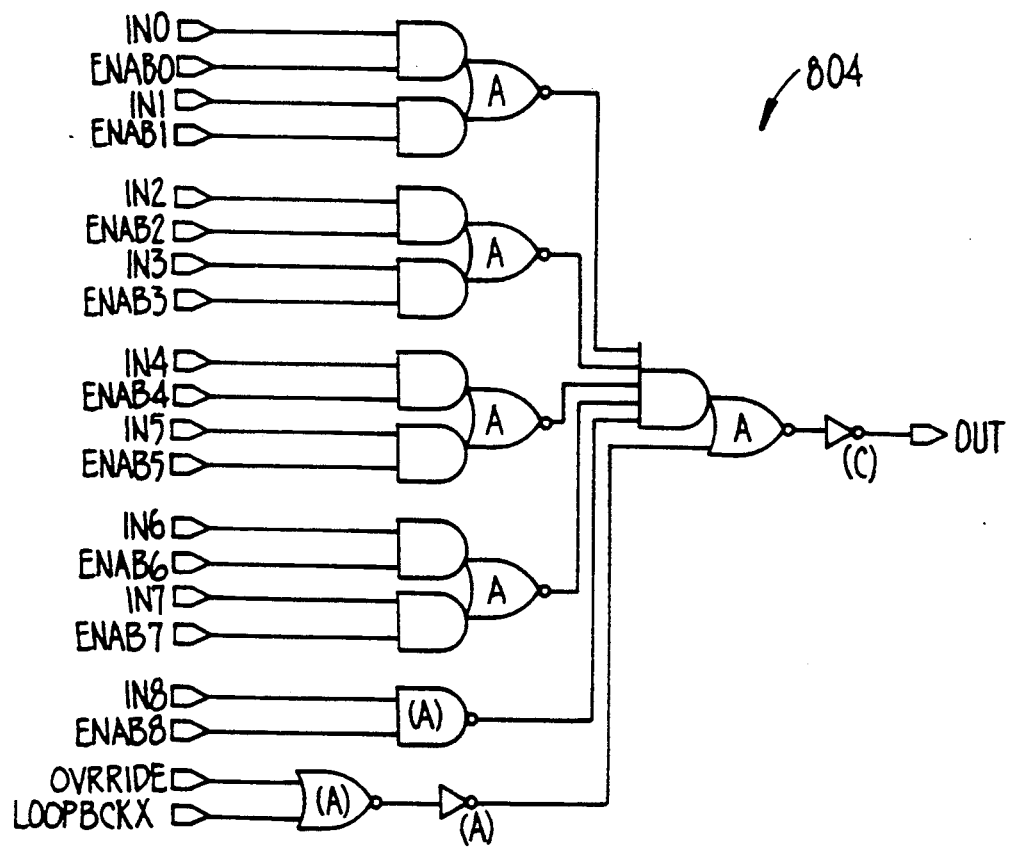

FIG. 19 is a detailed schematic diagram of the CSMUX 804 according to a preferred embodiment of the present invention. INx receives a respective carrier sense signal from port x. ENABx receives port x's associated MARXEN signal. As the reader will appreciate, an assertion of any INx, and its associated ENABx will assert OUT. Additionally, an assertion of OVRRIDE, derived from GENJAMT will deassert OUT, irrespective of a status of any INx and ENABx combination. LOOPBKX is a test mode not necessarily required for the present invention.

VI. Conclusion

The present invention provides an IMR which effectively shares resources among a plurality of ports integrated with a repeater into a single discrete device. The IMR provides a single physical timer providing signals to the ports enabling efficient performance of the link-test function and linkbeat generation. The IMR is able to selectively disable and enable the receive linktest function on a per port basis. The IMR includes a mechanism to provide a record of internal carrier sense signals associated with each port through two pins in conjunction with an appropriate. All the ports share a single phase-locked loop according to a preferred embodiment of the present invention. While the above is a complete description of the preferred embodiments of the present invention, various alternatives, modifications, and equivalents to these preferred embodiments are possible. Therefore, the above description does not limit the scope of the present invention. The appended claims define this scope and set forth the metes and bounds of the invention.

What is claimed is:

1. A serial scan circuit for a repeater, comprising:
   a plurality of ports, each port asserting a carrier sense signal when receiving information;
   means for polling said storing means during each of a plurality of successive sampling periods to provide a serial signal indicating each port's carrier sense activity during a sampling period; and
   means, coupled to each particular port of said plurality of ports, for storing a first value if said particular port asserted its carrier sense signal during a particular sampling period, otherwise said storing means storing a second value.

2. A serial scan circuit for a repeater, comprising:
   a plurality of ports, each port asserting a carrier sense signal when receiving information;
   means, coupled to said plurality of ports, for storing a plurality of values identifying whether each port's carrier sense signal had been previously asserted; and means for polling said storing means and providing a serial signal derived from said plurality of values.

3. A method for providing carrier sense signals from a repeater, comprising the steps of:
   storing a plurality of values identifying whether each port of a plurality of ports of the repeater asserted a carrier sense signal in response to receipt of information;
   polling periodically each said stored plurality of values; and
   outputting a serial signal derived from said polled stored plurality of values.

4. A multi-port repeater, comprising:
   a first and a second port for receiving encoded information, each asserting a first and a second carrier sense signal, respectively, when receiving said encoded information;
   a decoder having a data input and an enable input for decoding information provided at said data input when an enable signal provided at said enable input is asserted; and
   a multiplexer circuit producing a logical sum of said first and second carrier sense signals as said enable signal and providing said enable signal to said enable input of said decoder.

5. The multi-port repeater of claim 4 further comprising:
   means, coupled to said first and second port, for asserting a control signal if more than one carrier sense signal is asserted, and wherein
   said multiplexer circuit further includes means, responsive to an assertion of said control signal, of deasserting said enable signal irrespective of whether any of said first and second signals are asserted.

6. The multi-port repeater of claim 5 further comprising:
   means for enabling particular ports to receive information and asserting a qualification signal associated with said particular ports when said particular ports are enabled; and wherein
   said multiplexer circuit further qualifies each first and second signal with said qualification associated with said signal's port's qualification signal by producing a logical product of said qualification signal and said signal before producing said logical sum.

7. A method of sharing a decoder in a multi-port repeater, comprising the steps of:
   producing a carrier sense signal from each port of a plurality of ports when receiving information;
   multiplexing each port's carrier sense signal to produce a logical sum of said plurality of port's carrier sense signals; and
   enabling a decoder to decode encoded information from said plurality of ports when said logical sum is asserted.

8. The method of claim 7 further comprising the steps of:
   asserting a control signal if more than one carrier sense signal is asserted; and
   inhibiting an assertion of said carrier sense logical sum to deassert said logical sum if said control signal is asserted.

9. The method of claim 7 further comprising the steps of:
   producing a qualification signal associated with each port indicating whether a particular port is enabled to receive information; and
   qualifying each port's carrier sense signal with its associated qualification signal prior to production of said logical sum.

10. A serial scan circuit for a repeater, comprising:
    a plurality of ports, each port asserting a carrier sense signal in response to receipt of information;
    a polling circuit, coupled to said plurality of ports, for periodically sampling each said port during a sampling period;
    a plurality of latches, coupled to said plurality of ports, for storing a plurality of values identifying whether each port's carrier sense signal had been asserted during said sampling period; and
    a test port, coupled to said plurality of latches, for outputting a serial signal derived from said plurality of values.

11. The serial scan circuit for a repeater of claim 10 wherein said plurality of latches are connected among one another in a daisy chain fashion.

12. The serial scan circuit for a repeater of claim 11 further comprising:
    a token mechanism for polling said plurality of latches to provide serial information representing said plurality of values to said test port.

13. The serial scan circuit for a repeater of claim 12 wherein said token mechanism, after polling a particular latch of said plurality of latches, resets said particular latch unless the port corresponding to said particular latch continues to assert said carrier sense signal.

* * * * *